(12) United States Patent
Sambasivan et al.

(10) Patent No.: US 8,021,758 B2
(45) Date of Patent: Sep. 20, 2011

(54) ALUMINUM PHOSPHATE COMPOUNDS, COATINGS, RELATED COMPOSITES AND APPLICATIONS

(75) Inventors: Sankar Sambasivan, Chicago, IL (US); Krishnaswamy K. Rangan, Evanston, IL (US)

(73) Assignee: Applied Thin Films, Inc., Evanston, IL (US)

( * ) Notice: Subject to any disclaimer, the term of this patent is extended or adjusted under 35 U.S.C. 154(b) by 794 days.

(21) Appl. No.: 11/244,539

(22) Filed: Oct. 5, 2005

(65) Prior Publication Data

US 2006/0057407 A1    Mar. 16, 2006

Related U.S. Application Data

(63) Continuation-in-part of application No. 10/745,955, filed on Dec. 23, 2003, now Pat. No. 7,311,944.

(60) Provisional application No. 60/615,920, filed on Oct. 5, 2004, provisional application No. 60/615,986, filed on Oct. 5, 2004.

(51) Int. Cl.
*B32B 9/00* (2006.01)
*B32B 15/04* (2006.01)

(52) U.S. Cl. .............. 428/472.2; 428/457; 428/469; 428/472.3

(58) Field of Classification Search .......... 106/457, 106/469, 472.2, 472.3; 428/14.05, 14.12, 428/472.2, 472.3, 457, 469
See application file for complete search history.

(56) References Cited

U.S. PATENT DOCUMENTS

| | | | |
|---|---|---|---|
| 3,442,686 A | 5/1969 | Jones | |
| 3,839,078 A * | 10/1974 | Birchall et al. | 427/377 |
| 3,963,500 A | 6/1976 | Flowers et al. | |
| 4,289,863 A | 9/1981 | Hill et al. | |
| 4,303,732 A | 12/1981 | Torobin | |
| 4,336,338 A | 6/1982 | Downs et al. | |
| 4,450,184 A | 5/1984 | Longo et al. | |
| 4,671,909 A | 6/1987 | Torobin | |
| 4,702,963 A | 10/1987 | Phillips et al. | |
| 5,017,523 A | 5/1991 | Kimura et al. | |
| 5,434,008 A | 7/1995 | Felts | |
| 5,614,255 A | 3/1997 | Kimura et al. | |
| 5,622,769 A * | 4/1997 | Kozuka et al. | 428/209 |
| 5,679,232 A * | 10/1997 | Fedor et al. | 205/77 |
| 5,698,758 A | 12/1997 | Rieser et al. | |
| 5,713,974 A | 2/1998 | Martin et al. | |
| 5,792,550 A | 8/1998 | Phillips et al. | |
| 5,833,728 A | 11/1998 | Kimura et al. | |
| 5,849,055 A | 12/1998 | Arai et al. | |

(Continued)

FOREIGN PATENT DOCUMENTS

GB    1 322 722    7/1973
(Continued)

OTHER PUBLICATIONS

Francis, Lorraine Falter, "Sol-Gel Methods for Oxide Coatings", Materials and Manufacturing Processes, vol. 12; No. 6, 963-1015, 1997, Copyright 1997 by Marcel Dekker, Inc.

(Continued)

*Primary Examiner* — Jennifer C McNeil
*Assistant Examiner* — Jonathan C Langman
(74) *Attorney, Agent, or Firm* — Reinhart Boerner Van Deuren s.c.

(57) ABSTRACT

Composites comprising an aluminum phosphate-based coating component and methods for sealing porous substrate surfaces.

23 Claims, 6 Drawing Sheets

U.S. PATENT DOCUMENTS

| | | | |
|---|---|---|---|
| 6,022,513 | A | 2/2000 | Pecoraro et al. |
| 6,036,762 | A | 3/2000 | Sambasivan |
| 6,110,528 | A | 8/2000 | Kimura et al. |
| 6,210,715 | B1 | 4/2001 | Starling et al. |
| 6,358,532 | B2 | 3/2002 | Starling et al. |
| 6,461,415 | B1 | 10/2002 | Sambasivan et al. |
| 6,541,695 | B1 * | 4/2003 | Mowles ................ 136/252 |
| 6,554,948 | B1 | 4/2003 | Ferrier |
| 6,692,678 | B2 | 2/2004 | Krowl et al. |
| 6,878,871 | B2 | 4/2005 | Scher et al. |
| 6,951,770 | B2 | 10/2005 | Middleman et al. |
| 2002/0004111 | A1 | 1/2002 | Matsubara et al. |
| 2004/0011245 | A1 | 1/2004 | Sambasivan et al. |
| 2004/0138058 | A1 | 7/2004 | Sambasivan et al. |
| 2004/0258601 | A1 | 12/2004 | Matsubara et al. |
| 2005/0106384 | A1 | 5/2005 | Sambasivan et al. |

FOREIGN PATENT DOCUMENTS

| | | |
|---|---|---|
| GB | 1 322 724 | 7/1973 |
| GB | 1 322 726 | 7/1973 |
| GB | 1 451 145 | 9/1976 |
| WO | WO 2005/003033 A3 | 1/2005 |

OTHER PUBLICATIONS

Rothon, Roger N., "Novel, Low Curing Temperature, Glassy, Inorganic Coatings, Derived from Soluble Complexes of Aluminum and Other Metal Phosphates", Chemistry and Industry, Jun. 1, 1974, pp. 457-459.

Gugleilmi, Massimo, "Sol-Gel Coatings on Metals", Journal of Sol-Gel Science and Technology 8, 443-449 (1997), Copyright 1997 Kluwer Academic Publishers. Manufactured in The Netherlands.

Livage, J.; Barboux, P.; Vandenborre, M.T.; Schmutz, C.; Taulelle, F., "Sol-Gel Synthesis of Phosphates", Journal of Non-Crystalline Solids 147 & 148 (1992) 18-23, Elsevier Science Publishers B.V.

Lee, D.H.; Condrate, Sr., R.A.; Lacourse, W.C.; "FTIR Spectral Characterization of Thin Film Coatings of Oleic Acid on Glasses", Journal of Materails Science 35 (2000 4961-4970, Copyright 2000 Kluwer Academic Publishers.

Wilcox, David L.; Berg, Morris; "Microsphere Fabrication and Applications: An Overview", Mat. Res. Soc. Sump. Proc. vol. 372, Copyright 1995 Materials Research Society.

Moh, Kyung H.; "Sol-Gel Derived Ceramic Bubbles", Mat. Res. Soc. Symp. Proc. vol. 372, Copyright 1995 Materials Search Society.

Kim, Keykyoon (Kevin), "Fabrication of Glass and Micro- and Nanospheres from Liquid Precursors Using Droplet Generation and Sol-Gel Processing", Mat. Res. Soc. Symp. Proc. vol. 372, Copyright 1995 Materials Research Society.

Hagarman, James A.; "Hollow Borosilicate Microspheres from Aqueous Solution" Mat. Res. Soc. Symp. Proc. vol. 372, Copyright 1995 Materials Research Society.

Lui, Jay G.; Wilcox, Sr., David L.; "Design Guidelines and Water Extraction Synthesis Capabilities for Hollow Ceramic Microspheres for Low Dielectric Constant Inorganic Substrates", Mat. Res. Soc. Symp. Proc. vol. 372, Copyright 1995 Materials Research Society.

Japp, Robert M.; Papathomas, Kostas I.; "Low Dielectric Constant Laminates Containing Microspheres", Mat. Res. Soc. Symp. Proc. vol. 372, Copyright 1995 Materials Research Society.

Farooqui, M.M.; Evans, A.G.R.; "Solid and Hollow Micro and Spherical Structures in Polysilicon and Phosphosilicate Glass", Mat. Res. Soc. Symp. Proc. vol. 372, Copyright 1995 Materials Research Society.

Liu, Jay G.; Wilsox, Sr. David L., "Design Guidelines and Water Extraction Synthesis Capabilities for Hollow Ceramic Microspheres for Low Dielectric Constant Inorganic Substrates", Mat. Res. Soc. Symp. Proc. vol. 371, Copyright 1995 Materials Research Society.

Kellerman, David W.; "Review of Low Dielectric Constant Thick Film Electronic Ceramics using Hollow Microspheres", Mat. Res. Soc. Symp. Proc. vol. 372, Copyright 1995 Materials Research Society.

Webpage at http://adt.lib.swin.ed.au/uploads/approved/adt-VSWT20031218.142251/public/03chapter2.pdf, "Chapter 2. Experimental"; Dec. 18, 2003.

3M, "3M Ceramic Microspheres, Paints and Coatings Applications Profile", 3M Performance Materials Division, 3M Center, Building 223-6S-04, St. Paul, MN 55144-1000, www.3m.com/paintsandcoatings, issued Nov. 2003, Copyright 2003 3M.

Kim, S.H.; Liu, B.Y.H.; Zachariah, M.R.; "Synthesis of Nanoporous Metal Oxide Particles by a New Inorganic Matrix Spray Pyrolysis Method", Chem. Matter, 2002, 14, 2889-2899, Copyright 2002 American Chemical Society, Published on Web Jun. 17, 2002.

Tan, Qui, "Spray Drying Dielectric Ceramics", www.ceramicbulletin.org, Sep. 2004, CTS Communication Components, Inc., Albuquerque, NM.

Bertrand, G.; Roy, P.; Filiatre, C.; Coddet, C.; "Spray-Dried Ceramic Powders: A Quantitative Correlation Between Slurry Characteristics and Shapes of the Granules", Chemical Engineering Science 60 (2005) 95-102.

Moiseev, S.S.; Petrov, V.A.; Stepanov, S.V., "The Optical Properties of Heat-Insulating Ceramics Made of Microballoons of Aluminum Oxide", High Temperature vol. 41, No. 1, 2004, pp. 139-145, Copyright 2004 Russian Academy of Sciences and Kluwer.

Carlson, Krista; Webpage at ceer.alfred.edu/Research/Summer/carlsonreport.doc, "Production of Hollow Glass Microspheres from Amber Glass Frit", Internet Date: Apr. 2004.

Cochran, Joe K., "Ceramic Hollow Spheres and Their Applications", School of Materials Science and Engineering, Georgia Institute of Technology, Atlanta, GA 30332-0245, USA, Copyright Current Chemistry Ltd ISSN 1359-0286, 1998.

Lima, R.S.; Marple, B.R.; "From APS to HVOF Spraying of Conventional and Nanostructured Titania Feedstock Powders: A Study on the Enhancement of the Mechanical Properties", Surface & Coatings (2004) Copyright 2004 Elsevier B.V.

Bertling, Jurgen; Blumer, Jan; Kummel, Rolf, "Hollow Microspheres", Chem. Eng. Technol. 2004, 27, No. 28, Copyright 2004 Wiley-VCH Verlag GmbH & Co. KGaA, Weinheim.

Dombrovsky, L.A.; "Approximate Models of Radiation Scattering in Hollow-Microsphere Ceramics", High Temperature, vol. 42, No. 5, pp. 776-784, Copyright 2004 Russian Academy of Sciences and Springer Science.

"Outline of Impact Blasting", Copyright PII 1990.

Sepvolgyi, J.; Karoly, Z., "Preparation of Hollow Alumina Microspheres by RF Thermal Plasma", Key Engineering Materials, vols. 264-268 (2004) pp. 101-104, Copyright 2004 Trans Tech Publications, Switzerland.

Shabde, V.S.; Mann, U.; Hoo, K.A.; "Numerical Solution of a Model Associated with the Production of Hollow Micro-particles", Department of Chemical Engineering, Texas Tech University, Lubbock, TX 79409, 2004 AIChE National meeting, Session 169, Paper 1691.

Lange, S.; Schweiger, G.; "Thermal Radiation from Spherical Microparticles: A New Dipole Model", 2444 J. Opt. Soc. Am. B/vol. 11, No. 12/Dec. 1994. Copyright 1994 Optical Society of America.

Orel, Zorica Crnjak; Gunde, Marta Klanjsek; "Spectrally Selective Paint Coatings: Preparation and Characterization", Solor Energy Materials & Solar Cells 68 (2001) 337-353; Copyright 2001 Elsevier Science B.V.

Lima, R.S.; Marple, B.R.; "Near-Isotropic Air Plasma Sprayed Titania", Acta Materialia 52 (2004) 1163-1170, Published by Elsevier Ltd on behalf of Acta Materialia Inc.

Luo, P.; Nieh, T.G.; "Preparing Hydroxyapatite Powders with Controlled Morphology", Biomaterials 17 (1996) 1959-1964, Copyright 1996 Elsevier Science Limited.

Baillis, Dominique; Sacadura, Jean-Francois; "Thermal Radiation Properties of Dispersed Media: Theoretical Prediction and Experimental Characterization", Journal of Quantative Spectroscopy & Radiative Transfer 67 (2000) 327-363, Copyright 2000 Elsevier Science Ltd.

Conduct-O-Fil Conductive Additives, "Conduct-O-Fil Silver-Coated Hollow Glass Spheres", Potters Industries, Inc., an Affiliate of PQ Corporation, Valley Force, PA 19482-0840, Internet Date: 2010.

Ding, Xuefend; Yu, Kaifeng; Jiang, Yanqiu; Zhang, Hari-Bala Hengbin; Wang, Zichen; "A Novel Approach to the Synthesis of Hollow Silica Nanoparticles", Materials Letters 58 (2004) 3618-3621, Copyright 2004 Elsevier B.V.

Dombrovsky, L.A.; "Modeling of Thermal Radiation of Polymer Coating Containing Hollow Microspheres", High Temperature, vol. 34, No. 2, 2005, pp. 247-258, Copyright 2005 Russian Academy of Sciences and Springer Science.

Sizgek, E.; Bartlett, J.R.; "Production of Titanate Microspheres by Sol-Gel and Spray-Drying", Journal of Sol-Gel Science and Technology 13, 1011-1016 (1998), Copyright 1998 Kluwer Academic Publishers, Manufactured in The Netherlands.

* cited by examiner $R_{rms}=579Å$    $R_{rms}=145Å$

ALUMINUM PHOSPHATE COMPOUNDS, COATINGS, RELATED COMPOSITES AND APPLICATIONS

CROSS-REFERENCE TO RELATED APPLICATIONS

This application is a continuation-in-part of U.S. application Ser. No 10/745,955, filed Dec. 23, 2003 now U.S. Pat. No. 7,311,944, and further claims benefit of U.S. Provisional Applications 60/615,920 filed Oct. 5, 2004 and 60/615,986 filed Oct. 5, 2004, all of which are incorporated by reference herein.

FIELD OF INVENTION

This invention can relate to aluminum phosphate coatings deposited on substrates, for imparting desirable electrical, chemical, mechanical, and physical properties. The invention can also teach methods to seal porous materials and also teaches new compositions and modifications of aluminum phosphate materials.

BACKGROUND OF THE INVENTION

There are a number of prior art patents related to synthesis of aluminum phosphate materials primarily for use as a catalyst support including crystalline and amorphous forms. Most synthetic methods comprise of using a sol-gel technique with raw materials that include commonly available salts of aluminum and a variety of phosphorous sources including phosphoric acid, ammonium hydrogen phosphates, phosphorous acid, and others. Many of these methods yield crystalline forms and few thermally stable amorphous compositions (U.S. Pat. No. 4,289,863, Hill and al.; U.S. Pat. No. 5,698,758, Rieser and al.; U.S. Pat. No. 6,022,513, Pecaro and al.). The prior art materials, for example, cannot be used as a coating for protecting substrates from corrosion or oxidation at elevated temperatures.

It is desirable to use an amorphous dense coating that is thermally durable and stable to protect various substrates in industrial and consumer use applications. The prior art coatings are either not durable under certain atmospheric conditions or under certain harsh industrial or use environments where materials are subjected to thermal treatments or exposed to corrosive environments. Silica-based amorphous coatings have been developed and a recent patent prescribes a unique way to deposit such coatings (U.S. Pat. No. 6,162,498). However, the coating is not durable under certain harsh conditions and is not thermally stable at elevated temperatures or do not serve adequately as a transparent coating on glass. High temperature stable glassy or vitreous coatings have also been developed by initially coating substrates with a slurry of glass frits and subsequently treating the coated material to high enough temperatures to melt the glass fits and form the vitreous coating. Vitreous enamel coatings have been in existence for many decades with many different compositions. However, they are usually thick and deform at elevated temperatures. The requirement of high temperature processing to melt the glass frits may degrade the substrate and if low melting glass compositions are selected, they may not be durable.

Vapor deposited inorganic coatings are currently under use for many applications, however, they require expensive equipment and are not suitable for non-line of sight substrate geometries (For example, U.S. Pat. No. 3,442,686, U.S. Pat. No. 4,702,963, U.S. Pat. No. 5,434,008, U.S. Pat. No. 5,792, 550). Solution-derived inorganic coatings provide low-cost and conformal ability to coat substrates.

Some of the prior art inorganic coatings are also not completely transparent for use on glass where transmission properties are affected or other substrates where aesthetic property of the substrate (metallic appearance) needs to be preserved.

Brushed steel and other related solid surfaces are used extensively in facades in buildings, malls, elevators, table lamps, bath fixtures, cabinet doors, wall plates and others. Desirable properties of these surfaces include easy-to-clean and finger print resistance along with adequate durability under exposure from thermal load or heat, sun-light, various solvents and common cleaning agents, UV-radiation, and provide non-stick against foods and other related properties.

Porous surfaces are susceptible to contamination when used for storage and like purposes. Enamel, granite, marble, floor tiles, glass, porcelanized stoneware, oven and related cooking appliances in a kitchen, oven interior panels, food trays, cooktops and other ceramic surfaces possess micro as well as macro pores and defects which are not desirable in their end application. Sealing of pores on granite, for example on kitchen countertops, will help impart anti-staining properties. Hermetic sealing of these pores will also help reduce gas permeation which is important in certain applications. Polymer surface treatments are well known in the art to seal ceramic surfaces, however, their durability is limited under heat, exposure to cleaning solvents or agents, and are relatively soft. A suitable thin inorganic coating which is chemically inert and thermally stable is desired. Many of these applications represent high volume sales such that low cost coating techniques are important for consideration with solution-based dip or spray coating being the most preferred method of application. Such treatments can also enable self-cleaning surfaces, easy-to-clean, biosafety, aesthetic value, hardness and abrasion resistance, antimicrobial combined with solvent resistance. Also, such a sealant should have good thermal shock properties (for example, hot pan on granite table) and thermal stability; even if the sealant is worn off, the effect of filling pores on the surface would help extend the durability of the coating significantly. Inventive material on anodized aluminum parts and other related materials can provide improvements to performance and durability along with environmental and energy savings. The inventive material can be used as a hermetic sealing of ceramics and adhesion promoter (monolithic, composites, and glass-ceramic) in various applications including tile, substrates for electronic packaging and refractories to improve durability and lower gas permeability.

Silicon carbide has excellent properties for space-based and airborne platform optical materials, but the brittle nature along with the high hardness of the material makes it difficult to finish to tolerances required. Polishing the surface to a fraction of the wavelength of light to be reflected takes weeks to months, depending on size and shape of the substrate.

Current low dielectric materials do not have the required dielectric constant values in combination with thermal and mechanical stability. New low k materials are required to improve the present state of semiconductor field.

Researchers are working to combine polymer and metal-foil substrates with printable TFT backplanes to move flexible displays closer to commercial reality. For years, the "holy grail" of the display industry—as of yet, largely unobtainable—has been a thin, clear, flexible substrate with barrier properties equal to those of a sheet of glass. Again, the prior art has been somewhat deficient in this regard.

Photomasks are high precision plates containing microimages of electronic circuits. Architecture should be maintained to achieve defect free photomasks. Problems arise when the chrome layer is affected by environments or interlayer reactions. There are cosmetic defects including scratches on the chrome outside the array, damaged or partially removed AR coating, contamination on the chrome, glass chips on the edge of the mask, etc.—all of which need to be avoided. Coatings should be very thin, in the range of approximately 10 nanometers, and defect free.

Plastic materials, in general, are susceptible to degradation from abrasion, moisture attack, UV radiation, atomic oxygen, exposure to solvents, chemicals and many others. Vapor deposited inorganic coatings on plastics are currently under use for many applications, however, they require expensive equipment and are not suitable for non-line of sight substrate geometries (For example, U.S. Pat. No. 3,442,686, U.S. Pat. No. 4,702,963, U.S. Pat. No. 5,434,008, U.S. Pat. No. 5,792,550). Therefore, there is a need for low-cost solution-derived protective coatings (inorganic and inorganic-organic composite) for plastic substrates with suitable processing schemes to develop reel-to-reel or roll-to-roll continuous processing as well as the ability to coat complex-shaped substrates.

Unlike glass and metal, however, all polymers exhibit a measurable degree of permeability to gases and vapors. Numerous technologies have been developed to decrease the permeability of polymers, and thus increase their range of applicability to food and beverage packaging. A permeation barrier layer is also important whenever a permeant material has to be transported. Tubes and hoses for gasoline, fluorocarbon vapors, etc. (important in automotive and appliance applications), require barrier performance beyond that currently available. Likewise, thin defect and pinhole-free inorganic moisture and oxygen barrier coatings are need for these display applications.

SUMMARY OF INVENTION

In light of the foregoing, it is an object of the present invention to provide aluminum phosphate-based compounds, compositions, coatings and/or related composites or articles, together with methods for their use and preparation, thereby overcoming various deficiencies and shortcomings of the prior art, including those outlined above. It will be understood by those skilled in the art that one or more aspects of this invention can meet certain objectives, while one or more other aspects can meet certain other objectives. Each objective may not apply equally, in all its respects, to every aspect of this invention. As such, the following objects can be viewed in the alternative with respect to any one aspect of this invention.

For purposes of the present invention, the phrase "inventive material," mention thereof or reference thereto will be understood to mean any of the present aluminophosphate-based compounds or compositions, over the entire available range of Al:P stoichiometries, as may be used in conjunction with a method, composite, or article of this invention, and/or a film, layer or coating associated therewith, or as otherwise provided below, such compounds or compositions prepared or characterized as described herein, such compounds and compositions as may be alternatively expressed, respectively, as aluminum phosphate compounds and compositions, and prepared, characterized and/or applied as described in any of the aforementioned incorporated references and/or in U.S. Pat. Nos. 6,036,762 and 6,461,415 and co-pending application Ser. No. 10/362,869 filed Jul. 15, 2003, and Ser. No. 10/627,194 and PCT/US03/36976, filed Jul. 24, 2003 and Nov. 19, 2003, respectively, and Ser. No. 10/642,069 and PCT/US03/25542 filed Aug. 14, 2003, each of which is incorporated herein by reference in its entirety. Without limitation, as described herein and/or through one or more of the aforementioned incorporated patents or applications, the inventive material can include such aluminum phosphate-based compounds and compositions comprising dopants, particles and/or inclusions of organic molecules, polymers, carbon, silicon, metals, metal oxides and/or other metal ions/salts—including nonoxides—regardless of whether the aluminum content is stoichiometric, less than stoichiometric or greater than stoichiometric relative to phosphorous, on a molar basis. Embodiments of the inventive materials are available under the Cerablak trademark from Applied Thin Films, Inc.

The "inventive material" also comprises aluminum phosphate-based materials and can be deposited as a thin film on substrates using a specially-designed precursor solution that yields a unique form of amorphous aluminum phosphate. U.S. Pat. Nos. 6,036,762 and 6,461,415 issued to Sambasivan et. al and the above-referenced patent applications provide details regarding the precursor synthesis and chemistry, properties, and other processing details are provided. Various additions or modifications to surfaces coated with the inventive material are also considered embodiments of the present invention, examples of which are provided below.

Likewise, the term "substrate" or phrase "solid substrate" includes any solid materials including but not limited to polymers, plastics, ceramics, metals, alloys, silicon carbide, silicon, oxides, chalcogenides, pnictides, quartz, glass, and others.

One or more of the following objects can be achieved in conjunction with an inventive material coating on a variety of substrates, with particular emphasis on roll-to-roll continuous coating of substrates to provide substrate protection against various environmental factors including, moisture, oxygen UV light, and others. Accordingly, such inventive material coatings can act as protective as well as functional coatings.

It is an object of the invention to use inventive material coatings as an insulating layer with effective dielectric strengths for use in various applications requiring electrical isolation such as a photovoltaic device on a conductive substrate.

Another object of the invention is to provide a coating or film of the above character which can maintain given moisture content within a packaged volume.

It is an object of this invention to use the inventive material as anti-iridescent and anti-tarnishing coatings.

The invention pertains to an improved method of forming inventive material layer on a metal surface, to provide an interface for promoting adhesion between the metal surface and an organic polymer coating, and to the resulting oxide layer coated metal surface. The method involves applying, to a metal surface, the inventive material. The resulting coating layer can serve as an interface for promoting adhesion between the metal surface and an organic polymer coating.

An object of invention is also to use inventive material coating in housings for moisture sensitive devices, such as moisture sensitive optical devices, which comprise a plurality of metal plates soldered at their edges to define the housing, wherein an organic polymer coating is applied to at least the exterior surfaces of the housing at the joints to provide a moisture barrier which prevents corrosion at the joints.

One of the objects of the invention is to provide a method to deposit this inventive material coating as a thin, hermetic, microstructurally dense, uniform, and transparent coating using simple dip, spin, spray, brush or flow coating process.

It is an object of the invention is to use inventive material coatings to protect solid substrates from moisture, light, gases, chemicals and other environmental effects.

It is also an object of the invention to protect surfaces of solid substrates during processing and service at room and elevated temperatures.

It is also an object of the invention to improve the mechanical properties of solid substrates including but not limited to scratch resistance, stain resistance, abrasion resistance, erosion resistance, damage occurring from the impact of high velocity particles, rain, water, liquids and other objects.

It is also an object of this invention to protect space solid materials from low earth orbit environment such as high flux of atoms and molecules such as oxygen, hydrogen, nitrogen and like.

It is an object of this invention to use inventive material as primer or adhesion promoting layer on polymeric surfaces.

It is an object of this invention to use inventive material as primer or adhesion promoting layer on metallic surfaces.

It is an object of this invention to use inventive material as primer or adhesion promoting layer on ceramic surfaces.

It is an object of this invention to use inventive material as primer or adhesion promoting layer on metal chalcogenides surfaces.

It is an object of this invention to use inventive material as primer or adhesion promoting layer on solid substrate surfaces.

It is an object of this invention to use inventive material as an adhesive or bonding two of similar of different types of materials.

It is an object of this invention to use inventive material as an adhesive or bonding of two similar different optical materials.

It is an object of this invention to use the inventive material to cover the surface defects and seal of pores on solid substrate surfaces.

It is an object of this invention to planarize the coated solid substrates surfaces.

It is an object of this invention to reduce the friction on coated solid substrates surfaces.

It is an object of invention to use inventive material as an antistatic coating on solid substrates.

It is an object of the invention to use inventive material coatings as a low-dielectric layer on solid substrates.

It is an object of the present invention to use inventive material and modified inventive material coatings as antireflective layer on polymer and like substrates.

It is an object of the invention to use inventive material coatings as moisture and oxygen barrier in flexible displays architecture.

It is an object of the invention to use inventive material coatings as barrier against mechanical damage of solid substrates.

It is an object of the invention to use inventive material coatings for tailoring optical property of solid materials.

It is an object of the invention use inventive material coatings to protect polymers, thermoplastics and like materials against photo-degradation.

It is an object of the invention to use inventive material coatings to protect solid substrates against damaging microbials.

It is an object of the invention to use inventive material coatings on medical instruments and parts made of solid materials from chemical and physical damage.

It is an object of the invention to use inventive material coatings on medical instruments and parts made of solid materials from body fluids corrosion.

It is an object of the invention to use inventive material coatings and modified inventive materials on medical instruments and devices, implants and other parts to impart biocompatibility.

It is an object of the invention to use develop biocompatible materials incorporated inventive material and inventive material coatings on solid substrates.

It is an object of the present invention to provide a barrier film having high colorless transparency and a method for making the same.

Another object of the invention is to provide a film of the above character which has a thickness in the range of about 10-about 500 nm.

Another object of the invention is to provide a coating or film of the above characters which has low friction.

Another object of the invention is to provide a coating or film of the above characters which can be produced at a reduced cost.

Another object of the invention is to provide a coating or film of above characters which reduces the total volume of solid materials required in devices.

Another object of the invention is to provide a coating or film of the above character which reduces the difficulty of recycling.

Another object of the invention is to provide a coating or film of the above character which can be utilized for food packaging which can be used in microwave ovens.

Another object of the invention is to provide a coating or film of the above character which can be utilized for packaging food which can be used in a microwave unit and still be transparent with a long shelf life.

Another object of the invention is to provide a coating or film of the above character which can maintain given moisture content for contents packaged in the barrier film.

Another object of the invention is to provide a coating or film and method in which the barrier film can be produced at high production speeds.

Another object of the invention is to provide a coating which can planarize the polymer surface and can help in reducing the scattering of light.

It is also an object of the present invention to provide a functional coating preferably an electrically conducting or magnetic coating on solid substrates through the dispersion of additives in inventive material precursor solution.

It is also an object of the present invention to provide an improved aircraft transparency; by using inventive material coating on solid substrate and an electroconductive metal oxide coating disposed over the solid substrate.

It is also an object of the present invention to provide protective and adhesion promoter layer for aircraft transparency.

It is also an object of the present invention to develop inventive material mixed with inorganic polymers and molecules such as P and B containing material such as phosphazene, borazine or borozole.

It is also an object of the present invention to develop inventive material and inventive material coating dispersed with boron nitride, molebdenum silicide, molybdenum sulfide or other lubricant materials in order to form high temperature lubricant coatings.

It is also an object of the present invention to develop inventive material with low-dielectric constant by suitably modifying the microstructure of the inventive material, in particular increase the porosity of the inventive material coating.

This invention is directed toward the use of inorganic and inorganic-organic composite coatings based on aluminum phosphate compositions on plastic or polymeric substrates for improved protection against abrasion or wear and from environmental attack.

In particular, this invention relates to the precursor solution chemistry or curable coating composition utilized to derive the structure and nature of the protective coating deposited on plastic or polymeric substrates.

An object of the invention was to tailor the precursor chemistry containing Al, P, and O, and other species to form a coating with good adhesion and substantially inorganic coating under relatively low temperature curing conditions.

A further object of the invention is to include trapped water or hydroxyls, organics and presence of some nitrate or other salts in the substantially-inorganic coating to promote flexibility and toughness of coatings.

A further object of the invention, in general, is to add certain organic and inorganic additives to the curable coating composition containing aluminum phosphate compounds to favorably tailor the curing conditions for minimizing stresses and add other functionalities to the coatings.

A further object of the invention is to use multilayers comprising of an adhesion promoting underlayer, such a layer being substantially inorganic or an inorganic-organic hybrid in nature and overlayers that a) seal microcracks of the underlying layer that improve barrier properties, such layers being substantially inorganic or an inorganic-organic hybrid in nature, and b) comprise of certain organic or inorganic additives to improve solvent resistance or abrasion of the coating system, such that the total thickness of the multilayer system do not exceed about 15 microns, more preferably about 10 microns, and most preferably about 5 microns.

A further object of the invention is to develop stable sprayable formulations that are curable upon thermal or UV or IR radiation or microwave treatments. Curing can be effected with one or combination of more than one treatment methods.

A further object of the invention is to develop aluminum phosphate-based coatings that are substantially transparent to visible spectrum of the electromagnetic radiation.

A further object of the invention is to either deposit a top organic layer or to incorporate specific organic additives into the curable formulation to promote durable hydrophobic or hydrophilic properties.

A further object of the invention is to utilize the aluminum phosphate based coating composition as an adhesive to bond the plastic substrates to other metal, ceramic, glass, and other plastic materials.

One of the objects of the invention is to provide a method to deposit this inventive material coating as a thin, hermetic, microstructurally dense, uniform, and transparent coating using simple dip, spin, spray, brush or flow coating process.

It is an object of the invention is to use inventive material coatings to protect plastics, polymers and like materials from moisture, light, gases and other environmental effects.

It is an object of the invention is to use inventive material as barrier film against inert gases (e.g. oxygen, nitrogen, hydrogen), to chemically active gases (e.g. water, carbon dioxide), and to liquids and vapors (e.g. aromas, fine chemicals, gasoline).

It is also an object of the invention to protect surfaces of polymers during processing and service at room and elevated temperatures.

It is also an object of the invention to improve the mechanical properties including but not limited to scratch resistance, abrasion resistance, damage occurring from the impact of high velocity particles and other objects.

It is also an object of this invention to protect space polymers from low earth orbit environment such as high flux of atoms and molecules such as oxygen, hydrogen, nitrogen and like.

It is an object of this invention to use inventive material as primer or adhesion promoting layer on polymeric surfaces.

It is an object of this invention to use the inventive material to cover the surface defects and seal of pores on polymer surfaces.

It is an object of this invention to planarize the coated polymer surface.

It is an object of this invention to reduce the friction on coated polymer surface.

It is an object of invention to use inventive material as an antistatic coating on polymers and related substrates.

It is an object of the invention to use inventive material coatings as a dielectric layer. It is an object of the present invention to use inventive material and modified inventive material coatings as antireflective layer on polymer and like substrates.

It is an object of the invention to use inventive material coatings as moisture and oxygen barrier in flexible displays architecture.

It is an object of the invention to use inventive material coatings as barrier against mechanical damage.

It is an object of the invention to use inventive material coatings for tailoring optical property of polymeric and like materials.

It is an object of the invention use inventive material coatings to protect polymers, thermoplastics and like materials against photo-degradation.

It is an object of the invention to use inventive material coatings to protect against damaging microbials.

It is an object of the invention to use inventive material coatings on medical instruments and parts made of polymers and like materials from chemical and physical damage.

It is an object of the present invention to provide a barrier film having high colorless transparency and a method for making the same.

Another object of the invention is to provide a barrier film of the above character having high transparency.

Another object of the invention is to provide coating or film of the above character which has an overall reduced thickness.

Another object of the invention is to provide a film of the above character which has a thickness in the range of about 10-about 500 nm.

Another object of the invention is to provide a coating or film of the above character which will not curl the coated polymeric flexible substrate.

Another object of the invention is to provide a coating or film of the above character which has low friction.

Another object of the invention is to provide a coating or film of the above character which can be produced at a reduced cost.

Another object of the invention is to provide a coating or film of the above character which reduces the total volume of plastics or polymers required in devices.

Another object of the invention is to provide a coating or film of the above character which reduces the difficulty of recycling.

Another object of the invention is to provide a coating or film of the above character which can be utilized for food packaging which can be used in microwave ovens.

Another object of the invention is to provide a coating or film of the above character which can be utilized for packaging food which can be used in a microwave unit and still be transparent with a long shelf life.

Another object of the invention is to provide a coating or film of the above character which can maintain given moisture content for contents packaged in the barrier film.

Another object of the invention is to provide a coating or film and method in which the barrier film can be produced at high production speeds.

Another object of the invention is to provide a coating which can planarize the polymer surface and can help in reducing the scattering of light.

It is another object of the present invention to provide an improved polymeric substrate for an electronic or optoelectronic device through the inventive material coating, which can avoid or at least reduce the problems of the prior art.

It is also an object of the present invention to provide a functional coating preferably an electrically conducting or magnetic coating on polymeric substrate through the dispersion of additives in inventive material precursor solution.

It is also an object of the present invention to provide an improved aircraft transparency; by using inventive material coating on plastic substrate and an electroconductive metal oxide coating disposed over the plastic substrate.

It is also an object of the present invention to provide protective and adhesion promoter layer for aircraft transparency.

Accordingly, the present invention can relate to the development of material which can be inorganic, an organic-inorganic composite or predominately inorganic in composition. In certain embodiments, aluminum phosphate-based materials which can be useful in a number of applications where it can be used in powder, bulk, fiber, and as a coating. The present invention can relate to application of aluminum phosphate-based coating on a variety of solid substrates including but not limited to plastics, polymers, metals, alloys, ceramics, silicon, silicon carbide, quartz, sapphire, glass and other substrate materials. The present invention can also relate to retention of surface properties such as reflectivity of metal or other reflective surfaces through the aluminum phosphate-based material coating under a variety of exposure conditions including but not limited to high temperature treatment, UV radiation, moisture etc. This invention can also relate to application of aluminum phosphate-based coatings as barrier coating against the diffusion of gases, water and other fluids on a variety of substrates. This invention can also relate to use of aluminum phosphate-based precursor solution as spin-on-glass (SOG) material in systems with architecture consisting of narrow gaps and non-uniform surfaces, for example, semiconductor devices and optical layers. The present invention generally relates to surface treatment or coating of polymer and plastic solid substrates utilizing aluminum phosphate based material compositions. The present invention can also relate to a method of improving adhesion between polymer and other types of materials.

In part, the present invention can be directed to a configured composite comprising a substrate and a coating component thereon. The coating component can comprise an aluminum phosphate compound comprising an aluminum-to-phosphorous ratio that can range from less than about 0.5 to about 1, to about 10 to about 1, to about 20 to about 1, or, alternatively, to about 25 to about 1. Such a composite can be arranged about an axis substantially perpendicular to the configuration provided.

In certain embodiments, the substrate can be configurationally flexible, such that a composite thereof with such a coating component can be wound about a spool and/or unwound for subsequent fabrication into an article of manufacture. Accordingly, as would be understood in the art, such a substrate can be selected from a metal, a metal alloy, and a plastic. In certain such embodiments, such a metal substrate can be selected from stainless steel and brushed stainless steel. Regardless, as described elsewhere herein, a coating component of this invention can be substantially transparent in the visible spectrum and/or can provide a composite and iridescent appearance. Alternatively, such a coating component can comprise one or more additive components or agents to provide the composite and antimicrobial function, such agents as would be understood by those skilled in the art made aware of this invention. Further function or effect can be derived by interposing one or more interlayer components between the substrate and the coating component, such interlayer components, as also described herein.

In certain other embodiments, the substrate can comprise a plastic material comprising one or more of a polycarbonate and/or a copolymer thereof, a polyimide and/or a copolymer thereof, and a polyester and/or a copolymer thereof. Without limitation, other such polymeric materials are described elsewhere herein, and would be understood by those skilled in the art made aware of this invention. Regardless of substrate identity, a coating component therewith can provide a permeation barrier with respect to moisture, gas, and/or another permeant. Alternatively, such a component can provide a protective function, as to a plastic substrate, with regard to the deleterious effects of organic solvents. Regardless of functional benefit provided the substrate, an overlayer component can be positioned on or above the coating component, for further functional benefit of the composite. Depending on the substrate identity and various compositional aspects of the coating component, as described elsewhere herein, the coating component can be identified as comprising a structural moiety absorbing radiation in the infrared spectrum at about 1230 $cm^{-1}$.

In certain other embodiments, a substrate component can comprise a metal foil. Without limitation, such a substrate can be dimensioned, depending upon end use application, less than about 100 mils. Such foil substrates can be selected from aluminum, stainless steel, titanium, magnesium, nickel-based alloys and superalloys. As mentioned above, such composites can further include various interlayer components and overlayer components. For instance, without limitation, a metal overlayer component on such a coating component can provide a mirror-like reflective surface, benefiting such a composite for use in various lighting applications.

In part, the present invention can also provide a method of using an aluminum phosphate composition to seal a porous substrate surface. Such a method can comprise: providing a substrate comprising a surface component; contacting the surface component with a composition comprising an aluminum phosphate compound comprising at least one phosphate ester moiety; and heating the composition at a temperature and for a time sufficient to at least partially remove and/or oxidize one of the ester moieties. Without limitation, in such embodiments, the substrate can be selected from granite, marble, engineered or processed stone materials, porcelain, and a range of ceramic materials. Regardless, such a method can provide a surface component substantially planarized with a contacted composition substantially thermally-stable up to a temperature of about 1000 C.

In certain embodiments, such a composition can be sprayed on the surface component. Depending upon a particular application or processing requirement, such a composition can comprise at least one of an aqueous carrier component, a non-aqueous carrier component, and an aerosol propellant, such components as would be understood by those skilled in the art made aware of this invention. As contemplated within the broader aspects of this invention, such a method, can be used in conjunction with various kitchen appliances and counters, bathroom counters and fixtures, and flooring and wall tile components, whether during the manufacture of such articles or as such compositions can be subsequently applied thereto.

DETAILED DESCRIPTION OF CERTAIN EMBODIMENTS

Figure 1:
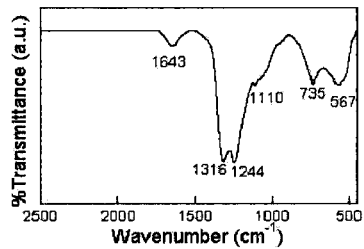
FIG. 1 is a FTIR image of the sample prepared in example 4 showing absorption peaks corresponding to phosphate and water groups in the coating.
Figure 2:
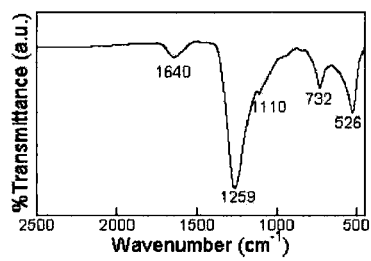
FIG. 2 is a FTIR image of the sample prepared in example 6 showing absorption peaks corresponding to phosphate and water groups in the coating.

Enamel surfaces used in kitchen appliances such as oven etc. are chemically complex with various alkalis mixed with alumino-borosilicate and are susceptible to chemical reactions with various food chemicals. The reaction products adhere strongly to the surface and cannot be easily removed requiring strong cleaning solutions (caustic treatments) which are toxic in nature. In addition, the surfaces have some level of porosity that cause mechanical interlocking of particles which are also difficult to remove. No surface treatment solution has been attempted due to the lack of a low-cost solution that affords a sealing effect with stable, inert, and low surface energy. The use of inventive material films as a seal coat represents the key innovation for this application.

For oven cavity applications, a inventive material coating is needed to reduce the surface porosity by at least 50%, to keep the burnt-on food from becoming mechanically interlocked with the enamel surface, making cleaning difficult. In addition, lowering the surface energy of the enamel will ease cleaning, analogous to using a Teflon® coated non-stick pan. Surface energy of less than 35 dyne/cm is desired for this type of applications.

Work on enamel coupons and ceramic tiles has shown the ability of an inventive material coating to adequately coat ceramic or metallic surfaces with a submicron thick coating. Mechanical interlocking is considered to be the major concern with this application due to the relatively rough surface morphology of the enamel surface. The relatively inert surface chemistry of inventive material is expected to be stable upon interaction with various food items at elevated temperatures in ovens.

Food processing equipments are sources for bacteria/biofilm attachment and growth which can turn into a serious health problem. One of the reasons for bacterial adhesion is the surface roughness helping the biofilm formation through mechanical interlock. Another is presence of moisture. Both these sources of bacterial adhesion can be eliminated using inventive material coating and inventive material coating along with an organic hydrophobic layer. Bacterial resistant coatings thus can be formed by reducing metal surface finish for example, by a factor of 5 that is down to the electropolish level using inventive material coatings. Inventive material coatings can also be used for cryomachined surfaces (in-lathe spray-coating and IR-lamp curing). Inventive material can also e used as an abrasion resistant coating on lenses and glass mirrors.

Inventive material can function as non-stick coating on polyester and other food packaging plastic substrates. As discussed, below, roll-to-roll coating process can be utilized along with flash curing to achieve high throughput of coated products.

Another embodiment of this invention is to use a low surface energy layer such as organo silane, fluorosilane, organic molecules or polymers over the inventive material coating. This top layer can help in several ways including, but not limited to, reduction or elimination of varnish-like residue formation from food at cooking temperatures. These overcoats can be reapplied very easily by spray techniques.

Another embodiment of this invention is use of the inventive material as a spray product for commercial or household applications.

The technical barriers are significant to yield uniform coverage at film thicknesses targeted (50-500 nm) using spray formulations. Most commercial spray coatings are relatively thick (few mils) and the processes are not amenable to developing high quality thin films. The degree of difficulty in developing suitable aqueous formulations, which are preferred for safety and environmental reasons, is even greater than the alcoholic counterparts. Many hazards, toxicity, flammability, waste, related to the use of alcohol-based precursors would be alleviated. Aqueous formulations do not offer suitable wetting properties and the shelf stability of aqueous formulations are poor.

Another embodiment of the present invention is the precursor modifications to develop suitable spray formulations. Aerosol technology is very amenable to various environments and users. Deposition of a continuous, submicron thick film will be our biggest challenge in prior art. In addition, the atomization parameters that will vary based on solvents and additives, surface coverage and wetting will vary from substrate to substrate.

Another embodiment of this invention is the development of water-based or water-ethanol mixture based inventive material solution. Wetting properties can be improved by enhancing the polymeric nature of the precursor solution via increasing polymer chain lengths by refluxing. To further improve wetting small amounts (<2 wt %) of commercially-available surfactants and/or a mixture of water/alcohol solvent can be used. Useful surfactants lower the surface tension of water, but are also chemically compatible with the precursor, and during curing (ease of solvent removal). Good quality coating can be applied to solid substrates including, but not limited to, enamel, stainless steel, glass, ceramics and polymers with known aerosol techniques for alcoholic solutions.

This invention can also provide an inexpensive, and rapid process to finish the surface of silicon carbide optics. This new process is suitable for a wide variety of types of SiC, and can be used, independent of fabrication technique, to planarize SiC surfaces for space- and land-based optical systems. Due to a low melting eutectic between aluminum phosphate and silica, inventive material coatings can planarize the surface of SiC through a reaction with the substrate.

The use of inventive material thin films, either alone or through the reactive mechanism, to planarize the SiC reflective is a significant improvement over current surface finishing techniques in terms of reduced cost and reduces time required. The surface roughness of a piece of sintered SiC was reduced over 100-fold (1 tan diamond abrasive surface polish to 2.7 nm rms roughness) by an investment of approximately 0.5 man-hours. Additionally, thin coatings of inventive material can be used to planarize surfaces of aluminum mirrors or silver mirrors as well as other non-optical substrates, without relying on the reactive mechanism.

Advantages of an inventive material based surface finishing process include:

- Substantially reduced cost to achieve a smooth (<10 nm rms roughness) surface
- Reduced time required to produce an optical quality finish
- Applicable to many ceramic as well as metal optical systems, regardless of ultimate mission
- No significant investment of processing equipment will be required to achieve an optical quality finish
- The process of depositing inventive material is extremely simple and versatile. The precursor solutions used to develop the coatings have low-viscosity, are clear and stable (shelf life extends over years), and are suitable for dip and spin coating processes.
- The surface obtained is glassy in nature and conventional or MRF-based finishing techniques can be used to further decrease surface roughness Thus the present invention offers the opportunity to obtain a glassy layer on ceramic surfaces via heat treatment or direct deposition of inventive material films which can be polished with similar procedures used for glass mirrors while exploiting the superior mechanical and thermal properties of ceramics such as, but not limited to, silicon carbide and silicon nitride.

Without wishing to bound by any theory, inventive material coatings on silicon carbide appear to promote the formation of an aluminophosphosilicate glass upon high temperature anneal. It is known from the prior art that there is an eutectic in the $AlPO_4$—$SiO_2$ system at 70 mol % $SiO_2$ which melts at 1400° C. Coatings of inventive material applied on sintered SiC appear to form a glassy phase after 1400° C. anneal. Without wishing to bound by any theory it is believed that the oxidation of SiC to $SiO_2$ provides the silica to form the reaction phase. The phase on the surface appears to be glassy, lacking a crystalline appearance. Under the optical microscope and with surface evaluation by SEM, it is apparent that the surface is significantly smoother than the original substrate or the uncoated, annealed sample.

Hexyloy SiC was polished with 1 μm diamond slurry, resulting in a surface finish on the order of 1-3 μm. Hexyloy SA is 99% pure sintered SiC. Hexyloy is somewhat porous (compared to CVD SiC), and these pores were effectively sealed with the inventive material coating. This substrate was coated and heat treated, along with an uncoated sample. After heat treatment, the coated sample was highly reflective, indicating a smooth surface. The rms roughness of the coated sample was reduced to about 2.7 nm as measured by AFM. The uncoated, annealed and as-finished surfaces were significantly rougher and maintained a relatively porous surface morphology. Not including initial polishing, the procedure of coating and heat treating took approximately 0.5 man-hours of time. (In this case, the polished (1 μm diamond abrasive) silicon carbide substrate was cleaned ultrasonically, then dip coated with inventive material solution, then heat treated in a laboratory furnace.) Without wishing to bound by any theory, the aluminum phosphate present in the inventive material is believed to react with silica formed from the oxidation of the silicon carbide. In addition, no cracking was observed upon cooling suggesting a relatively good CTE match for the glass with the SiC substrate.

In addition, the inventive material enabled excellent protection of SiC from oxidation at elevated temperatures. Substantial reduction in weight gain was observed for the coated material as compared to as-received silicon carbide after exposures up to 1400 C for over 100 h. Incorporating silicon into the inventive material may serve as the silicon source to form the aluminosilicate-phosphate glass compositions. Some loss of phosphorous is observed after high temperature anneal, however, the surface appears well sealed to afford environmental protection. In a modified method, other substrates can also be used by first depositing SiC coating by any of the known methods, including CVD, and then treat the surface with inventive material as described. C/C and C/SiC composites used in high temperature applications require protection against oxidation. Such treatments can be considered to enhance protection of these and other non-oxide and oxide composite systems.

The present invention can be employed to promote good adhesion between an organic polymer coating and the surface of metals that may or may not develop an oxide layer. The phosphate and aluminate groups can covalently bond with a metal atom at the metal surface. The inventive coating composition may also contain at least other organic or organo silane or organo phosphate overlayers for improving bonding with organics and polymers. Alternatively, other organic or organo silane or organo phosphate layers having at least one reactive moiety which is capable of bonding with an organic resin may be applied separately as another over layer. The invention is particularly useful for providing a inventive material interface which promotes adhesion between a relatively inert metal surface, such as a noble metal surface, e.g., gold, silver, platinum, palladium, iridium, rhenium, ruthenium and osmium, and an organic polymer coating. Adhesion promotion effect of inventive material coating is not limited to metal-polymer materials. This can include metal-ceramic, ceramic-polymer, glass-polymer, glass-ceramic, ceramic-glass, ceramic-ceramic and other systems as well.

Present invention also related to the iridescent, non-iridescent, anti-tarnishing and high reflection (high reflectance) coatings on stainless steel and like surfaces. Protective oxide coatings on stainless steel with thickness less than <1 micron, exhibit iridescent colors due to difference in the refractive index of substrate to coated layer. Inventive material amorphous aluminum phosphate thin coatings on stainless steel are effective against oxidation at elevated temperatures and hence anti-tarnishing. They also retain or improve the reflectivity of the coated metal surface. This coating also shows iridescent colors which can exploited as decorative coatings on articles. Without wishing to be bound by any theory, inventors believe that the iridescent color observed on coating depends on the chemistry, thickness and the uniformity of coatings.

Inventive coating material can be used along with under coats and overcoats to modify the reflectivity, iridescent, gloss and other optical effects due to thin coatings. Any phosphorus material that contains a phosphorus atom with a valence of 3 or 4 may be used as under coat. The phosphorus compound can be organic or inorganic. Organic phosphate can be, such as, but not limited to organic phosphites, phosphates, phosphonates, hydrogen phosphites, hydrogen phosphates, polyphosphates, polyphosphonates, phosphate esters, phosphite esters, phosphines, alkyl chlorophosphines, chlorophosphates, and mixtures thereof. Inorganic phosphates can be, such as, but not limited to, metal phosphates, phosphoric acid mixed with suitable solvents, phosphorus pentoxide solutions, phosphorus halides, phosphorus and mixtures there of. Over coats can be organic or inorganic or hybrid coatings. Organic over layers can be such as, but not limited to, self assemble monolayers of organic molecules or polymers. Siliane based coatings can also be used as over coatings. Inventive material itself can function as under as well as over coat. Inventive material coating also can have organic or inorganic additives. Inorganic additives can be metal ions such as, but not limited to, silicon, iron, zinc and manganese and or mixtures thereof. Nano-crystalline oxides, such as, but not limited to, zinc oxide, titanium oxide and mixture thereof.

Inventive material coating can be made as a porous bulk material using organic templates such as polymers and large organic molecules. Inventive material with designed porosity can be used as a low k dielectric material and as a coating for silicon, gallium arsenide and other semiconductors, particularly for silicon carbide which is a high temperature semiconductor and needs a thermally stable low k dielectric layer. Spin-on glass as the process can be used deposit the inventive material layer that can also serve as an effective diffusion barrier. Porosity in the inventive material can be designed to be in the nanoscale so that the coating can maintain good mechanical properties. The organic content in coating composition can be modified to help improve toughness of the layer as well as to minimize cracking due to processing.

Sealing surface defects on glass, polymer and other related substrates used in semiconductor, solar cells, flexible displays can be effectively achieved using inventive material coating. Further, inventive material coatings can act as a barrier layer for diffusion of oxygen, moisture, sodium and other environmental factors.

The inventive material films can also useful in seal defects on quartz, glass and other substrates used as photoblanks in semiconductor industry. The inventive material can also be etched in submicron scales, if required, using chemical or physical methods.

Iridescent glass coatings on steel or other surfaces can enhance the aesthetic value of a surface. Inventive material when coated on metallic surfaces shows iridescence. Such coatings may be applied as art form, signs, part labeling, and many others.

It is a very difficult task to achieve continuous and crack free coating in micro scale levels using solution based processes. It is more difficult with architecture containing gaps and non-uniform surfaces structures. In the prior art such coatings are achieved via spin-on-glass coating of silicates, borosilicates and phosphosilicates in semiconductor devices. However they have drawbacks like cracking and sodium diffusion and other problems. Semiconductor industry is looking for cost savings technologies which can replace the existing ones along with reduced cost of manufacturing, equal or higher performance and combining multiple properties in a single material.

Coating should be thick and dense enough to prevent or limit sodium diffusion as well as should be crack free. Both combinations are difficult to achieve using sol-gel coating techniques. With suitable modification of coating techniques and composition of the inventive coating material, these conditions can be achieved. The coating should be able to planarize the coated substrate in order to build up multilayers over the coatings. The coating materials should be stable with high dielectric breakdown strength. Liquid surface tension effects that might be creating problems in achieving continues coverage or coating on edges can minimized or removed using suitable additives, composition, viscosity, and concentration of inventive materials and modified inventive material precursors.

The inventive material can be used as a spin-on-glass coating on substrates like, but not limited to quartz, silicon, silicon carbide, gallium arsenide and other substrates. An inventive material coating has characteristics such as, but not limited to, insulating, low dielectric constant, planarizing and ionic barrier etc. which are essential for coating on semiconductor devices. Similar coatings can be formed any type of non-uniform surfaces irrespective of their surface chemistry because of the strong adherent nature of inventive material. Inventive material and its modified precursors can be used both as conformal-coating as well as planarizing-coating depending the coating thickness and methods. Inventive material coating can also be combined with other planarizing techniques like MRF or CMP to achieve better quality surfaces if needed. The coating also can protect semiconductor devices from problems arising from sodium diffusion from handling environments. The inventive material and modified inventive material precursors can be used as flowable gap-fill materials using spin-on-glass technique. Thus inventive material can be used to develop flowable Spin-On insulator. Based on spin on glass technique, small and products with complex geometry such as but not limited to, fasteners, can be coated with inventive material for protection against galvanic corrosion (for example, steel fasteners into an aluminum chasis) and degradation from solvents, chemicals, and other environmental attack.

Metal and polymer foil substrates are used in various applications including displays, photovoltaics, heat shields, and others. Thermally-Stable coating of the inventive material can be deposited continuously on these substrates for imparting desirable properties. Multifunctional nature of the inventive coating material can provide substantial benefits over prior art materials at low processing cost and high throughput. For example, the inventive material can be deposited to impart electrical isolation and to provide a smooth surface. This avoids the commonly-used expensive PVD or CVD process to deposit alumina layer with further coating layer/s required to impart sufficient planarization. For the food packaging industry, the inventive material can be deposited on plastic substrates in a continuous roll-to-roll manner and impart non-stick properties against food. The inventive material will also provide suitable barrier properties against gases that diffuse in or out of the food packaging material.

Vacuum based coatings inherently contain pin-holes and other defects due the processing methods. Thin inventive material coating on vacuum based coatings can remove these defects and can be effectively increase the barrier properties of coatings. Further, an inventive material coating can act as a planarizing template for developing other types of coatings.

Devices, especially micro- and nano-fluidic devices use molds made from a plastic material by below molding, dip molding, film insert molding (FIM), gas assist molding, reaction injection molding, resin transfer molding, rotational molding, structural foam molding, thermoplastic injection molding, vacuum assist resin transfer molding (VARTM), vacuum bag molding, vacuum forming, injection molding, compression molding, extrusion blowmolding, thermoforming, UV reaction molding or embossing or other molding processes. These devices find application in a variety fields such as, but not limited to biomedical devices, optical communication systems (where part dimensions are under 1 mm and tolerances are under 1 μm) and others. Micro-optical parts with nano-structured surfaces, and large-area automobile windows with perfect clarity and long-term resistance to attrition, are at the cutting edge of plastics processing technology. Microfluidic lab-on-a-chip systems hold great potential for many laboratory applications, including clinical diagnostics and life sciences research. A number of devices that are well suited to handle the tough requirements of real clinical samples such as whole blood and other bodily fluids are being developed. The devices can be used in stand-alone applications as self-contained passive disposables for qualitative and semiquantitative assays and separation applications, or they can serve as components of sophisticated instrument-based systems.

Quick and efficient release of a molded part from the tool is the key to any efficient molding process. During processing, high heat resins, for example, polyetherimides, may reach temperatures over 700° F. resulting in decomposition of many standard mold release additives. New high-temperature mold releases are needed for open the processing window allowing for better reproduction of surfaces in parts and faster molding cycles with reduced scarp in parts. The molding surfaces include metals, silicon and others.

Plastics-processing also requires that the mold release coatings used in molds to be a permanent one. Other goals include better coatings for wear resistance, corrosion resistance, and improved resin flow. Successful coatings yield improved part release and part quality, protection of the mold against wear from abrasive materials, and reduced buildup of deposits, allowing faster mold cleaning. Significant economic benefits are also gained by eliminating downtime caused by parts sticking in molds, broken ejector pins, and improperly working machine parts such as backflow valves. The net effect can be decreased cycle times and longer maintenance intervals.

For example, a P-20 mold with a hardness of 40 Rockwell C and a cavity perimeter of 12 by 18 inches, was molding parts that were reluctant to release despite a Teflon-nickel coating, lapping compound and wire-brush treatment, and a mold release application prior to every shot. In addition, the final step in the part's 72-second cycle involved a worker gingerly extracting it from the mold by hand while trying not to cause any distortion or warpage. Peeling a part proved to be time-consuming, and costly. Scrap rates ranged from 30 to 40 percent. It has been determined that a finish of 6 μm on the tool's surface was necessary for a speaker grille application of this kind to release automatically. Using conventional EDM technology, it is possible to achieve a finish of only 12 to 14 μm after 150 hours of finishing work. After 150 hours, any better surface finish than that could be achieved.

Inventive material technology may be useful as a permanent mold release coating. Inventive materials can be beneficial in reducing the surface roughness below 6 μm with the fraction of the work and cost that requires for conventional polishing techniques. Along with reducing surface roughness, surface energy of the coated surface also can be reduced with a over organic layer which can be self assembled or a layer on its own. Improved energy and finish with inventive material coating on 12 micron surface could be very beneficial for plastic and microfluidic industries. Various types of materials such as polymers, metals, alloys, high temperature stable polymers, etc., are used in molding, depending upon application requirements.

A window on military aircraft, whether it is a canopy on a fighter jet or the covering on an infrared sensor must be exceptionally sturdy to withstand being battered by debris at high velocities, yet remain transparent to allow the pilot to see out, or the infrared signal to reach in. Windows made of conventional yttria tend to crack in flight conditions. Inventive material can be used as a medium to disperse such nanoparticles in high loads and applied as coating. This can serve as a cost-effective method for coatings on infrared store scanners and other applications. It can also help in extending the lifetime of canopies on fighter jets.

Various other uses and applications of the present invention include the following:

Inventive material coatings can be used in thermal spray coating industry. For example, inventive material can be used as an infiltrating sealer for MCrAlY-class turbine blade spray-coatings and feedstock for cold-spray coating applications.

Inventive material coatings with or without hydrophobic over layer can be used a low-wettability windshield glass coatings.

Low-temp amorphous inventive material coating/$Al_2O_3$ coatings can be used in various fields including but not limited to electronics, textiles and polymers.

Inventive materials can be used as anticatalytic coatings for Ni-rich components used in hot gas handling systems.

Inventive materials can be used as infiltrants for powder-metallurgy components (sinter-hardenable).

The inventive material can be used in Fuel-cell and gas reforming components (hot surfaces) as a coating composition.

Inventive material coatings on metals can be used as interface layers for adhesion improvement along with corrosion protection and improvement of lacquer adhesion. Inventive material coatings are also useful for opto-electronic and other sensors with regard to their low dielectric properties. Electrically insulating inventive material layers are need for the design of solar cells on metallic foils. Inventive material coatings act as a protection layer between the electrical back contact of the solar cells and the conducting substrate.

Thickness requirement of inventive material coating varies with the application.

Following table lists some of the application along with a useful, non-limiting required layer thickness.

| Application | Layer Thickness |
| --- | --- |
| Optical layer stacks for highly reflective and antireflective coatings | 10 nm-200 nm |
| Transparent gas barrier coatings on plastic webs | 30 nm-100 nm |
| Abrasion resistance coatings on polycarbonate sheets | 4-6 microns |
| Interface layers for adhesion improvement (several substrates) | 5-20 nm |
| Conversion layers on steel (corrosion protection, lacquer adhesion) | 0.3-0.4 microns |
| Dielectric coatings (sensors, back side protection of solar cells) | 2-5 microns |

Inventive material coatings can be very beneficial for regulating the properties of variety of substrate surfaces. For example, glass slides manufactured by different companies may not have the same composition. Even for the same manufacturer different batches of glass slides may not match exactly. For example, the surface roughness might vary depending on the treatment these samples underwent. It is very critical in some applications to have almost identical surface characteristics in samples, like for example, in the case of micro arrays. Inventive material coatings can provide uniform surface characteristics for example, uniform surface chemistry uniform surface roughness etc.

Metals and alloys such as titanium, $Ti_6Al_4V$, CoCr are widely used as materials for orthopedic implants due to their excellent mechanical properties and nontoxic behavior. The high strength and fatigue resistance as well as availability, easy processing and low cost explain the important roles gained by metals in implantology. A particular importance is given to titanium and its alloys and CoCr alloys, because these metals may be integrated into surrounding tissues, and especially hard tissues, alloys and exhibit chemical and mechanical bonding, indicative of good biocompatibility/histocompatibility and biofunctionality. Different and high rates of corrosion influence the choice of an implant material, since fretting corrosion among others may contribute strongly to the production of wear particles which might lead to a particle disease and to implant loosening consecutively. Affinity of metallic surfaces to microbial contaminants and biofilms is also a major problem. The rate of implant infection, necessitating the riskful exchange of the implant, even in good clinics, can reach 2%-3%. The careful design for first time implants and for exchange implants has to face the problems of stress shielding and loss of bone stock. Most of the prior art coatings are cracked and has poor relaibility of glass-metal interface. So, strongly adhering protective and biocompatible coatings will be highly beneficial.

A variety of methods have been developed in prior art to modify the surfaces of polymers, metal and alloys or other biomaterials used in the device industry. Examples include conventional coating processes such as spraying or dipping; vacuum deposition techniques; and such surface-modification technologies as diffusion, laser and plasma processes, chemical plating, grafting or bonding, hydrogel encapsulation, and bombardment with high-energy particles. Traditionally, the goal was to achieve improved physical or mechanical properties in a component or device—for example, by adding a nonstick coating to a catheter for easier insertion. Increasingly, however, surface modification also aims at inducing a specific desired bioresponse or inhibiting a potentially adverse reaction. Low friction, hydrophilic, hydrophobic and other functional coatings are also needed for invasive instruments, products and accessories used to treat carotid artery and bile duct blockages and peripheral vascular disease, and for use with carotid artery stenting, guide wires, catheters, etc.

The present invention relates to the development of protective, functional and biocompatible coatings based on the inventive material. Compositions of the inventive material can be tailored to fit the need for coatings on medical devices and implants. Inventive material coating on metallic or polymer substrates can decrease the coefficient of friction to a considerable extent. After the coating and curing the inventive material surface be made hydrophilic or hydrophobic. Using self-assembly for organic layers or coating of organic layers on inventive material coating suitable functionalities can be imparted. Hydroxyapatite or other bioactive nano particles can be incorporated in to the inventive material coating to improve biocompatibility. Bioactive layers for example, hydroxyapatite can be deposited using vacuum, plasma or sol-gel based coating techniques. In this case, inventive material coating can act as a adhesive layer to improve adhesion between metal or polymeric medical device substrates with bioactive materials.

Inventive material coatings can effectively prevent or reduce the devitrification of fused silica or quartz and other amorphous materials used in, for example, surgical probes, lighting products etc. from reaction with alkali and other species.

Boundary lubrication is known to enhance the lubrication properties of many systems. Present invention deals with the deposition of the alkylfluorosialnes on the surface of the inventive material coating and the stability of such organic layers. A smooth surface is highly desirable for low friction characteristics, but requires extensive surface preparation, and the presence of surface defects such as pits on alloy surfaces limits the quality of surface finishes. A well-adhered, abrasion resistant coating which can planarize the surface will be of great utility for tribological applications. Inventive Material film can also prevent the corrosion of the substrate both from the lubricant and from the atmosphere. The hermetic inventive material coating can protect the substrate from the lubricant and also from corrosive species present in the atmosphere.

Embodiments of inventive material coatings on polymers and like materials offers a) excellent protection against light radiation (for example, UV radiation), b) excellent protection against damaging acid, alkali, organic solvents and other chemicals c) adequate sealing of defects (such as pits) and cover particles on polymeric surfaces such that the coating planarizes the coated surface and reduces the surface roughness (d) excellent barrier against inert gases (e.g. oxygen, nitrogen, hydrogen), to chemically active gases (e.g. water, carbon dioxide), and to liquids and vapors (e.g. aromas, fine chemicals, gasoline), (e) excellent barrier against atomic oxygen, nitrogen, oxygen, hydrogen and other elements found in low earth orbits or developed in laboratories, (f) excellent protection against mechanical damage of the polymeric surfaces occurring from a variety of sources (for example, customary handling of the material, impact with high velocity materials etc.) (g) excellent protection against oxidation (h) excellent protection against corrosion (i) excellent protection against moisture, (j) excellent protection of bio-medical polymers used in medical applications against corrosion from body fluids and chemicals and microbials (k) to reduce the coefficient of friction of the polymer surfaces through planarization and (l) increase the abrasion resistance of coated polymer surfaces. Among these, a relevant and innovative attribute, without wishing to be bound by theory, is the ability of the inventive material to promote formation of a dense, continuous, smooth and strongly adherent inorganic or predominantly inorganic or inorganic-organic composite coatings.

With regard to examples of polymers forming a plastic film or substance, cellulose esters (e.g., triacetyl cellulose, diacetyl cellulose, propionyl cellulose, butyryl cellulose, acetyl propionyl cellulose, nitrocellulose), polyamides, polycarbonates, polyesters (e.g., poly(ethylene terephthalate), poly(ethylene naphthalate), poly(1,4-cyclohexanedimethylene terephthalate), polyethylene-1,2-diphenoxyethane-4,4'-dicarboxylate, poly(butylene terephthalate), polystyrenes (e.g., syndiotactic polystyrene), polyolefins (e.g., polypropylene, polyethylene, polymethylpentene), polysulfones, poly(ether sulfone), polyarylates, poly(ether imides), poly(methyl methacrylate) and poly(ether ketones) are included. Triacetyl cellulose, polycarbonates, poly(ethylene terephthalate) and poly(ethylene naphthalate) are preferred. Packing materials consist of polymers, for example polypropylene PP, polyethylene PE, polyamide PA, PET, and laminate films made from various polymer materials, e.g. PP/PE, PET/PP, PET/PE, PE/PA.

The plastic layer used in flexible display devices can be made from for example, polyesters, polycarbonate, polyvinylbuterate, polyethylene and substituted polyethylenes, polyhydroxybutyrates, polyhydroxyvinylbutyrates, polyetherimides, polyamides, polyethylenenaphalate, polyamides, polyethers, polysulphones, polyvinylacetylenes, transparent thermoplastics, transparent polybutadienes, polycyanoacrylates, cellulose-based polymers, polyacrylates and polymethacrylates, polyvinylalcohol, polysulphides and polysiloxanes.

The substrate also can be in the form of lamination, the plastic layer of the composite is coated onto the glass layer by any suitable process. That is, it is possible to consider the different situations (i) where plastic exists already as film and is laminated to the glass and (ii) where plastic is not in film form but is coated onto the glass by dip, spray, and other processes. The pre-polymers mentioned above, for example, are amenable to case (ii). However, also several of the other plastics mentioned above can be coated for case (ii). In this instance the polymers can be coated onto the glass principally by: coating from solution, from a melt or as pre-polymer.

The substrate can also be any organic, preferably organic polymers having high temperature thermal stability. The polymers can be thermoplastics or thermosets, preferably high temperature thermoplastics such as polyimides, polyamide-imides, polyetherimides, bismalemides, fluoroplastics such as polytetrafluoroethylene, ketone-based resins, polyphenylene sulfide, polybenzimidazole, aromatic polyesters, and liquid crystal polymers. In addition polyolefines, particularly crystalline high molecular weight types can be used.

Curing can be effected by any methods which can result in condensation and formation of Al—O—Al, P—O—Al groups. For example, thermal treatment, exposure to UV light of relevant frequency, increasing the pH of the solution above 3, exposure to IR radiation, exposure to microwave radiation, exposure to chemicals that can hydrolyse P—OR groups, addition of suitable chemicals which can increase the condensation rate or combination of any of the above methods.

Adhesion of inorganic coatings to a polymer is a major problem that limits the use of coatings reported in prior art. Measuring adhesion by tape test was performed on polyimide samples (similar to ASTM D-3359 test) coated with inventive material. 3M™ Scotch™ tape was applied over the coating and then removed rapidly. There was no removal or loss of adhesion of the inventive material coating on polyimide film. Optical microscopic observation of inventive material coated polyimide films after bending by 180° also did not show any cracking of coating. These results indicate the strong adhesion of Cerablak™ coating on polymers. Phosphate based coatings are known to show strong adhesion on polymers. For example, calcium phosphate on polyethylene and poly(tetrafluoroethylene) showed adhesion strength of 6.4 and 5.8 MPa respectively. With out wishing to bound by any theory we believe that the strong adhesion is presumably due to the formation of C—O bond between phosphate groups and polymer interface during curing of the coating. The adhesion can also be improved by pre-treating the substrates with Ar ions. Inventive material precursor solution is mildly acidic and will not damage the acid sensitive polymeric substrate surfaces during coating process.

The organic groups attached to phosphorus in the precursor solution can be reduced or eliminated completely by replacing P—OR groups with P—OH groups. However, any chemical change in the precursor solution may affect the condensation and formation of the thin film. Some embodiment of the inventive precursor solutions can retain the aluminophosphate complexes with characteristic [O=P—O—Al—O—Al] bonding. With out wishing to bound by any theory we believe, the organic content can be reduced significantly by increasing the relative content of "P—OH" species. In addition to using water or other non-alcoholic chemicals as solvents, the organic content may be reduced by using sterically hindered alcohols for example, iso-butyl alcohol as a solvent for aluminum nitrate. The reaction rate of iso-butyl alcohol with condensed phosphate (P—O—P) groups is low. Even if P—O-i-Bu groups are formed in solution they can be readily removed on refluxing, forming 2-methyl propene, which is a gas at room temperature (b.p. 6.6° C.).

Wetting of low surface energy polymers with alcohols is a challenge. Adhesion is of concern since high curing temperatures may be needed to improve adhesion. In the case of polyimide films adhesion of inventive material coating shown to be excellent with out any surface treatment. In the case of poor coating adhesion with some polymers, surface modification of the polymers can be adopted. Several techniques, such as deposition of primer, use of surface assembled monolayers SAMs, oxygen plasma etching and sulfochromic bath treatment can be used to improve wetting. Inventive material coating can also be used a primer or adhesion promoting layer for other metallic, polymeric and inorganic coatings.

Underlayers and overlayers can be selected from any organic polymer coatings, inorganic-organic hybrid coatings, or metallic coatings. These layers also can be formed from inventive material of same of different composition. These layers also can be formed by inventive material precursor modified with any inorganic or organic functional agents. For example, UV absorbers.scatterers like ZnO, $CeO_2$ or $TiO_2$ oxides for UV radiation protection, Ag ions for antimicrobial activity, transparent metal oxides like ITO for electrical properties, $SiO_2$, $Al_2O_3$, $ZrO_2$ to improve mechanical properties, or photocatalytic species like $TiO_2$ to impart hydrophilic properties. Several layers of these under and over layers can be built depending upon the requirements. Inventive material coating can planarize the polymer surface along with suitable modified refractive index can help in reducing the scattering of light from coated polymeric substrates.

EXAMPLES OF THE INVENTION

The following non-limiting examples and data illustrate various aspects and features relating to the composites, articles and/or methods of the present invention, including the use of various aluminum phosphate compounds and related compositions therewith, as are available through the synthetic methodologies described herein. In comparison with the prior art, the present compositions, composites, articles and/or related methods provide results and data which are surprising, unexpected and contrary thereto. While the utility of this invention is illustrated through the use of several composites/ articles and aluminum phosphate-based coating compositions used therewith, it will be understood by those skilled in the art that comparable results are obtainable with various other composites/articles and coating compositions, as are commensurate with the scope of this invention.

Example 1

One preferred method for depositing an amorphous aluminum phosphate coating is with a clear chemical precursor solution, with the solution preferably containing an aluminum salt and phosphate esters in an organic solvent. A solution used to deposit amorphous aluminum phosphate coatings with a 2 to 1 aluminum to phosphorus ratio is made by dissolving 264 g of $Al(NO_3)_3.9H_2O$ in 300 mL ethanol. In a separate container, 25 g $P_2O_5$ is dissolved in 100 mL ethanol. These solutions are mixed together. The resulting solution is diluted with ethanol to a concentration of 0.2 moles Al/L solution. This solution is used to deposit amorphous aluminum phosphate coatings on substrates.

Example 2

A solution used to deposit amorphous aluminum phosphate coatings with a 4 to 1 aluminum to phosphorus ratio is made by dissolving 528 g of $Al(NO_3)_3.9H_2O$ in 300 mL ethanol. In a separate container, 25 g $P_2O_5$ is dissolved in 100 mL ethanol. These solutions are mixed together. The resulting solution is diluted with ethanol to a concentration of 0.2 moles Al/L solution.

Example 3

A stainless steel plate cleaned with detergent and water followed by ultrasonication in methanol. Dipped in solution prepared in example 1. Dried using a heat-gun. Dried sample is heated at 400° C. for 1 min and cooled to room temperature. The cured stainless steel plate surface showed strong iridescence. This type of inventive material coatings may be applied as decorative coating on articles.

Example 4

A stainless steel plate cleaned with detergent and water followed by ultrasonication in methanol. Then, dipped in an alcoholic solution consisting of phosphate and aluminum mixture. Then, dried using heat-gun. Dried sample is heated at 400° C. for 1 min and cooled to room temperature.

Example 5

Infrared Reflectance-Absorption Spectroscopy of the sample prepared in example 4 is recorded using Perkin Elmer Spectrum One spectrometer using 80° grazing angle accessory (FIG. 1).

Example 6

An over coat of precursor solution prepared in example 1 is applied by dip coating on the sample prepared in example 2. Then, the sample is heat treated at 500° C. for 15 minutes and cooled to room temperature. Uncoated part of the plate is discolored due to oxidation. Coated part is shiny and retained silver color. The precursor solution concentration, compositions and coating conditions are strongly depend on the surface morphology of coated surface. Thus, iridescence effect of inventive material coating may be removed by suitably modifying the precursor and coating methods.

Example 7

Infrared Reflectance-Absorption Spectroscopy of the sample prepared in example 6 is recorded using Perkin Elmer Spectrum One spectrometer using 80° grazing angle accessory (Fig.).

Example 8

On the surface of the stainless steel coated with inventive material finger print impression is made by pressing thumb on the surface. Then a clean cloth is used to wipe the impression. The thump impression can be removed very easily from the coated surface leaving aesthetically pleasing clean surface. It is not possible to remove finger print impression from the uncoated surface using similar cleaning method.

Example 9

Stain resistant effect of inventive material coating on solid substrates has been demonstrated in this example. Variety of materials such as Ketch-up, H2O+NaCl, Tomato, Lemon, The, Coffee, Milk, Acetic acid, Citric acid 20%, Lard+oleic acid, Jam, Butter, Olive oil and other items are left on a inventive material coated stainless coupon and allowed to dry at room temperature and 90° C. Then washed with water and then visually checked for any stain on the coated surface. Inventive material coated surface did not show any stain.

Example 10

Inventive material coated stainless steel samples prepared in example 5 is tested for pencil hardness. The pencil hardness found to be above 6H.

Example 11

The reflectivity of the inventive material coated surfaces was measured before and after heat treatment up to 700° C. The reflectivity was retained by the coated surface as compared to uncoated control sample.

Example 12

A small crystalline alumina (Sapphire) sample cleaned with deionized water, acetone and methanol. Then dip coated using precursor solution prepared in example 2 (4:1 Al/P ratio). The withdraw rate of dip coating is 2 cm/sec. Then, cured at 800° C. for 10 minutes. A transparent coating resulted.

Example 13

Figure 3:
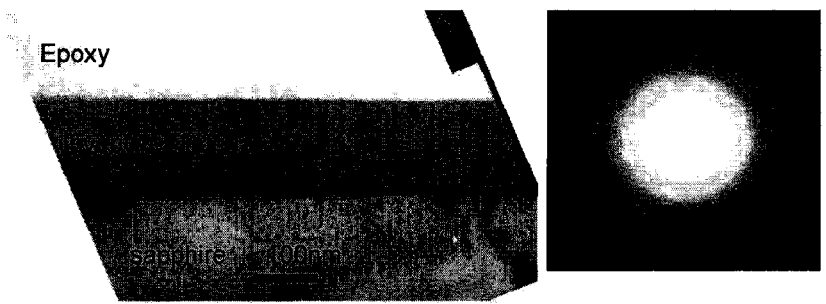
FIG. 3 is a cross-sectional TEM image and of inventive material coating on Sapphire showing hermetic, dense and uniform nature. Electron diffraction pattern corresponding to inventive material layer shows non-crystalline nature.

TEM image of inventive material coating on Sapphire shows the hermetic, dense and uniform inventive coating (FIG. 3). Electron diffraction pattern obtained from the inventive material coating shows the amorphous nature of the coating. Inventive material film is uniform with a thickness ~140 nm. High resolution TEM showed typical amorphous contrast in the film. There is an interfacial layer (~5 nm) between inventive material and sapphire.

Example 14

Figure 4:
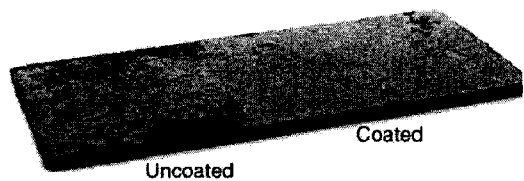
FIG. 4 is a photograph of enamel coupon partially coated with inventive material after food-adhesion test.

Testing of partially inventive material coated enamel coupon show evidence for relative ease the removal of tomato sauce cured at 300° C. for 15 minutes from the coated region compared to from the uncoated area using only water and a soft cloth (FIG. 4). This residue appeared to be well bonded to the substrate when observed under optical microscope.

Example 15

Figure 5:
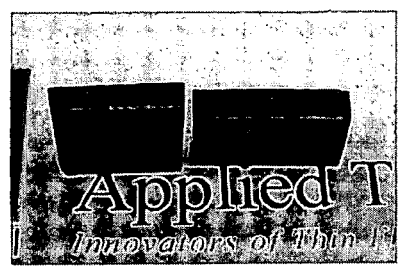
FIG. 5 is a photograph of uncoated silicon carbide surface with 1 µm polish (left) and inventive material coated SiC after heat treatment (right), showing reflective surface.

Uncoated SiC surface with 1 μm polish and inventive material coated SiC after heat treatment, showed reflective surface as compared to uncoated (FIG. 5).

Example 16

Figure 6:
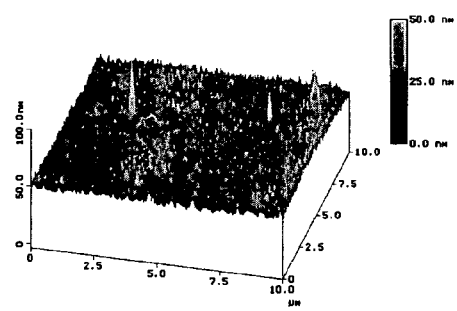
FIG. 6 shows atomic force microscopic (AFM) images of inventive material coated, heat treated silicon carbide.

AFM images of inventive material coated, heat treated SiC, showing extremely smooth surface (FIG. 6).

Example 17

Figure 7:
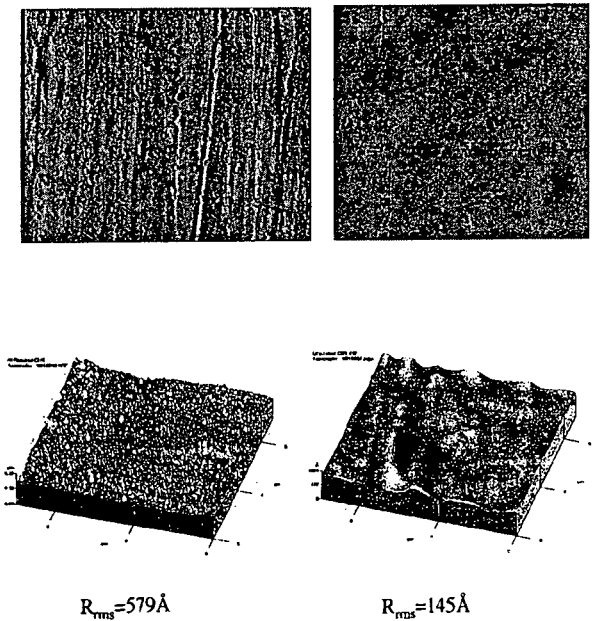
FIG. 7 shows AFM images of inventive material coated, heat treated metal alloy.

Based on the hermetic nature of inventive material films observed for a number of metal, alloy, and glass substrates, it is expected that inventive material can serve well to seal microscale surface defects on polymers. FIG. 7 shows an AFM image of a metal alloy surface coated with inventive material demonstrating the significant planarization effect induced by the film. A greater than 4× decrease in surface roughness is seen with the presence of the film.

Micron-scale surface defects on metal surfaces (even after polishing to sub-micron finish) serve as initiation sites for oxidation. As the metal substrates get oxidized during high temperature oxidation, these small surface defects serve as initiation points for oxidation. These small defects become large pits. However, depositing a relatively thin inventive material film sufficiently covers these defects so that pitting is essentially eliminated. These results demonstrate the potential for inventive material to seal off micron-scale defects (scratches, pits, etc.) on coated surfaces.

Example 18

Figure 8:
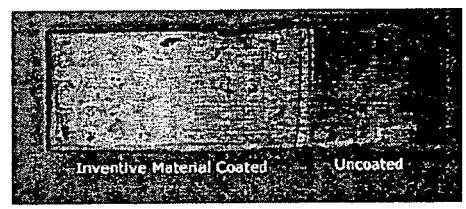
FIG. 8 is a photograph of copper plate partially coated with inventive material.

A copper block 1"×3" dimensions was cleaned in acetone and methanol sonication. Then dip coated in inventive material precursor solution. Dried in air and heat treated in a furnace at 200° C. for 15 min. Photograph shows the effect of inventive material coating after this heat treatment (FIG. 8). Inventive material coated part is remains bright and shiny. On the other hand uncoated side is tarnished completely. Similarly copper, brass and other metallic wires can also be coated with the inventive material and protected against oxidation and environmental damages.

Example 19

Figure 9:
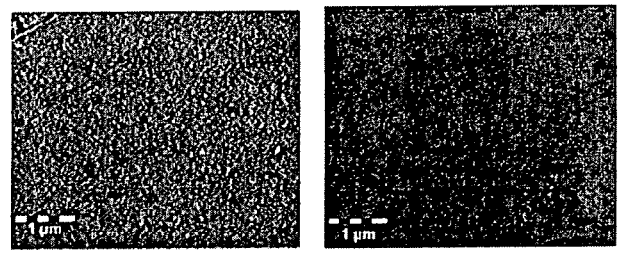
FIG. 9 shows AFM images of uncoated Glass (rms ~1-2 nm) (left) and Inventive Material Coated (rms ~0.1-0.2 nm) (right).

AFM image of glass slide coated with the inventive material is shown in FIG. 9 along with the uncoated glass. The inventive material coated surface is very smooth and rms roughness decreased an order of magnitude from the uncoated glass.

Example 20

Formation of crack-free coating of a ceramic material on a polymeric substrate is a technological challenge because of large coefficient of thermal expansion mismatch and the heat sensitive nature of polymer substrates. Residual thermal stresses lead to film cracking, especially if the coating is cured at elevated temperatures. This can be minimized if the coating thickness is kept to a minimum and increase the adhesion energy of the film to the substrate. With inventive material both these conditions can be achieved because of low viscosity and phosphate based precursor solution which readily decomposes upon pyrolysis at relatively low temperatures. Optical image of inventive material coating on polyimide composite showed the planarization effect on the coated surface. Inventive material also covers the defects and hermetically seals the surface without forming such cracks.

Example 21

Polyvinyl pyrrolidone, PVP (M.W. 630,000) is dissolved in inventive material precursor solution prepared in example 2. The amount of PVP in solution can vary from 0-100 wt %. The viscosity of the solution increases with increase in PVP content. The solutions can also be prepared directly by mixing PVP with $Al(NO_3)_3$ and $P_2O_5$ solutions. PVP with other molecular weights also can be used.

Example 22

A polycarbonate sample (1"×1") is dipped in sulfochromic bath for 30 sec. Then washed with plenty of deionized water. Then, dip coated with inventive material precursor prepared in example 2. Dried the coated sample with a heat gun. Then heat treated in an oven at 130° C. Transparent coating formed after curing for a period of time.

Example 23

A polycarbonate sample (1"×1") is dipped in sulfochromic bath for 30 sec. Then washed with plenty of deionized water. Then, dip coated with modified inventive material precursor prepared in example 3. Dried the coated sample with a heat gun. Then heat treated in an oven at 130° C. Transparent coating formed after curing for a period of time.

Example 24

Methylethylketone solution is dropped on the surface of inventive material coated polycarbonate film prepared in example 5. No reaction with polycarbonate observed. This suggests the protective ability of inventive material coating against chemicals and its good barrier nature.

Example 25

Nano sized zinc oxide particles dispersed in a medium is mixed with inventive material precursor solution prepared in example 2. The amount of Zinc oxide can be varied. The solutions can also be prepared directly by mixing zinc oxide with $Al(NO_3)_3$ and $P_2O_5$ solutions.

Example 26

Figure 10:
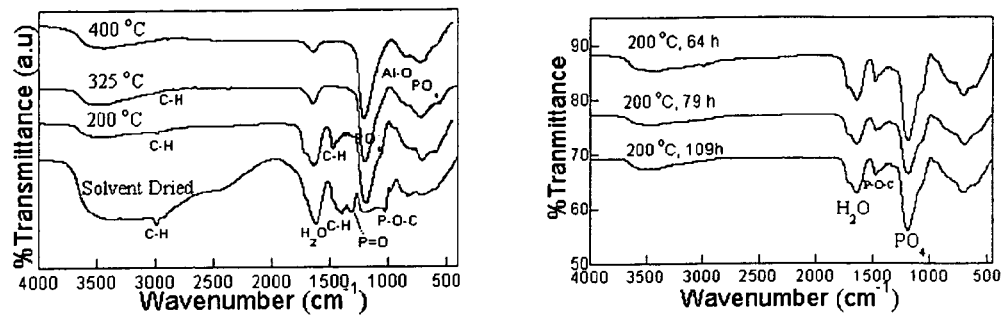
FIG. 10 shows FTIR spectra of inventive material coating on stainless as a function of temperature length of heat treatment at 200° C.

In order to determine the curing state of the inventive material coating, FTIR Reflectance spectra of inventive material coated stainless steel foils were recorded as function of temperature and duration of heat treatment (FIG. 10). Organic absorption peaks due to phosphate esters (1370, 1432, 1473.1720, 2987 $cm^{-1}$) decreases in intensity and a single strong absorption near 1200 $cm^{-1}$ due to completely linked PO$_4$ group appears with increase in curing temperature and time. As the curing temperature increased, duration of heat treatment required can be shortened. Based on the FTIR data, curing temperature of 325° C. is needed to obtain completely inorganic coating with some water inclusions. A crack-free coating was obtained by curing one inventive material coated polyimide films up to 340° C. The curing temperature and stability of coating can vary depending on the substrate nature, thickness and pretreatment conditions. The curing temperature can also vary depending on the composition of inventive materials precursor solution. It is interesting to note that the FTIR data of the samples heat treated at 200° C. for longer duration showed little change in the residual water content in the coating which could indicate that the coating is dense and hermetic enough even at 200° C. curing. According to this study, a curing temperature of 200° C. should be sufficient to form protective coating on polymers. But, higher temperatures may provide better adhesion and the hermetic quality will be better.

Example 27

Figure 11:
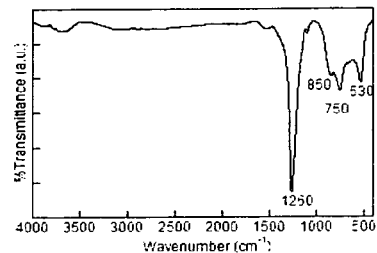
FIG. 11 is a FTIR spectra of flash-cured inventive material coating on a stainless steel foil.

A clean stainless steel foil is coated with precursor solution prepared in example 1. Heat treated the sample in a furnace at above 800° C. for few sec. Grazing angle infrared reflection spectrum of flash-cured inventive material coating (FIG. 11) shows the absence of organics and water molecules and formation of completely cured inorganic metal phosphate layer. During this flash-curing process the surface coating reaches the temperature above 500° C. while the substrate is below 250° C. This flash-cure technique is preferred for certain types of coating processes such as roll-to-roll and thermally sensitive substrates such as polymers.

Example 28

Figure 12:
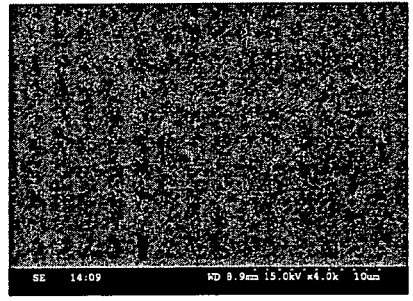
FIG. 12 is a SEM micrograph of inventive material coated surface of polyimide film.

Polyimides are classified as organic resins and are used in engineering applications due to their exceptional heat and chemical resistance. In the semiconductor industry, these materials are primarily used as substrates for flexible printed circuit boards and for integrated circuit applications in the wireless, digital and the computer industries. The surface finish of these materials has a direct impact on their performance and therefore optimizing these conditions is critical. Inventive material is coated on a cleaned polyimide film and cured at 300° C. for 1 hr. SEM image of inventive material coated polyimide film (FIG. 12) showed crack-free nature of the coating. Also particles on the polyimide surface are covered by inventive material coating.

Example 29

Figure 13:
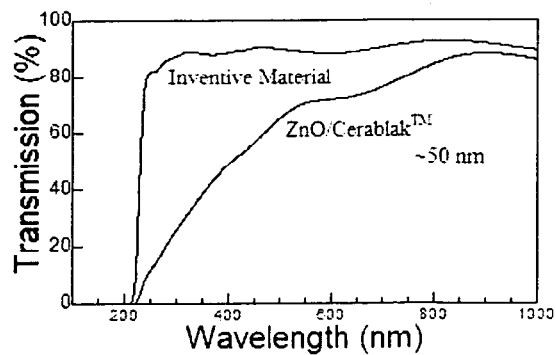
FIG. 13 is a UV-Vis absorption spectrum of the undoped inventive material and zincoxide nanoparticles dispersed inventive material coating.

UV absorption reduction by 40% upon addition of nanoscale ZnO (<10 mol %) into inventive material coating. This example shows the effect of UV absorber addition to inventive material. UV-Vis transmittance spectra of inventive material and ZnO dispersed inventive material coated on a sapphire plate (FIG. 13).

Example 30

Figure 14:
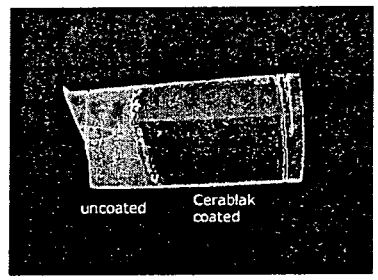
FIG. 14 is a photograph of fused quartz sample partially coated with inventive material showing the barrier effect of coating against environmental attack.

Silica glass products containing inventive material coating or surface treatment can prevent silicate reactions with environment during service. The results of this example demonstrate this effect of an inventive material coating on a fused silica sample. A fused quartz sample is partially coated with inventive material and treated with sodium sulfate, 900° C., 15 h. Under this treatment conditions uncoated fused quartz became opaque due to the reaction with sodium ions, where as the inventive material coated part remain transparent, showing the barrier effect of the inventive material coating against sodium ion diffusion (FIG. 14).

Example 31

Embodiments of the inventive material can also serve as a chemically and thermally stable bonding agent or adhesive. In these experiments, modified precursor solution was applied to one surface to be bonded, and the other surface was pressed to the first, to ensure that the precursor solution adequately covered the surface of both pieces to be bonded. The two pieces were clamped together and heat treated to form the inorganic material. The joints made showed relatively good bond strengths considering the low level of effort in these preliminary experiments. Phosphorus content will effect both transmission and adhesive strength. The phosphorous rich composition of inventive material may show some absorption in the IR range, due to the relatively high phosphorus content but bonding may be more stronger. Bonding experiments were performed on both glass and stainless steel coupons. The glass had an extremely smooth surface, while the steel had a #3 finish. These experiments have demonstrated that inventive material based adhesives are capable of bonding substrate materials of varying surface finish.

Figure 15:
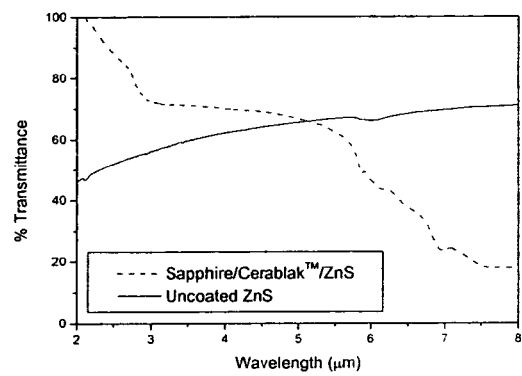
FIG. 15 is a transmission spectra of sapphire/ZnS bonded couple. The decreased transmission above 6 µm is due to sapphire.

To provide further evidence of direct relevance to this application, of sapphire plate (rectangular) was bonded to a ZnS disc coupon. The couple was annealed to 450° C. in air for one hour to test the thermal stability of the joint. The materials remained well bonded suggesting the robust nature of the inventive material adhesive. Transmission spectral measurements of the bonded couple indicate good transparency in the 3-5 μm range with decreased transmission above 6 μm due to the opacity of the sapphire (FIG. 15).

Example 32

Figure 16:
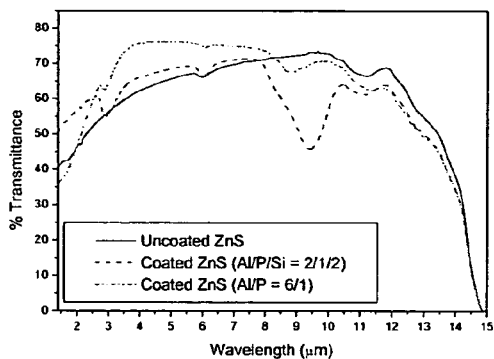
FIG. 16 is a transmission spectra of inventive material On ZnS.

The inventive material can be synthesized over a wide range of Al/P ratios (e.g., from 0.5/1 to 10/1 and to 25/1), including addition or doping of other elements, such as silicon, which may be necessary to induce specific functional properties. As seen in FIG. 16, a comparison of transmission properties of two inventive material films of varying compositions on ZnS reveals that an Al/P ratio of 6/1 show negligible phosphate absorption compared to a relatively-rich phosphate composition with silicon addition (silica also absorbs around the same region). However, because the good adhesion is provided by the phosphate species, a balance between transmission and high adhesion strength may need to be found. Thus, the Inventive material system allows for flexible compositional variation to tailor specific properties.

Example 33

Applications of coatings on polymers

| Industry | Function of coating | Examples |
| --- | --- | --- |
| Aerospace | Diffusion barrier, Antistatic coating Protection against space environmental effects | Bathroom Mirrors, Lighting Covers, Thermoformed Parts Trays & Tables, Windows |
| Appliance | Diffusion barrier against moisture and oxygen | Consoles & Membrane Switches, Fascia Panels, |

| Industry | Function of coating | Examples |
| --- | --- | --- |
| Automotive | Protection against mechanical damages (erosion); easy-to clean and hydrophobic coating for windshields Antireflective coating Antistatic coating | Food Storage Containers, Printed Labels & Nameplates Bumper Assemblies, Glazing |
| Building & Construction | Protection against erosion Easy to clean and hydrophobic coating Anti reflective coating | General Glazing, Lighting Panel Glazing, Office Interiors, Privacy Glazing, Public Buildings, Roof Lights, Separated Walls, Skylights, Sound walls, Wall Panels, Windows |
| Electric & Electronics | Electrical insulation, diffusion barrier | Enclosures, Insulation Barriers, Printed Circuits |
| Machinables | Protection against mechanical damages (wear, erosion) | Bushings & Bearings, Gears |
| Maintenance & Material Handling | Protection against wear and erosion. Coating of | Chute Liners, Conveyor Wear Strips, Fabricated Parts, machine Guards, Thermoformed Trays |
| Marine | Protection against mechanical damages Hydrophobic coatings | Dive Platforms, Exterior, Interior, Upholstery Components |
| Optical Media Printing | Moisture Barrier Protection against mechanical damages | Displays - LCD, OLEDs Decorative laminates, Membrane Switches, Nameplates, Overlays |
| Safety Equipment | Protection against mechanical damages | Goggles, Machine Guards |
| Sign & Display | Protection against mechanical damages | Back lighted Signs, Building Fascia, Canopies, Channel Letters, Ground Mounted Industrial Nameplates, LED Covers, Menu Covers, Pole Mount, POP Displays, Thermoformed Signs, Tradeshow Booths, Vending Covers, Wall Mounted |
| Telecom & Business Equipment | Protection against mechanical damages Easy to clean optical parts | Cell Phone Covers, Die-cut Insulators, Keyboards & Keypads, Lenses & Covers, Monitors & Displays |
| Transportation | Protection against mechanical damages | Bug Shields, Glazing, Interiors, Thermoformed Parts |

Example 34

With reference to one or more of the preceding descriptions or examples, various composites and/or product components can be prepared using roll to roll or continuous manufacturing processes known in the art and as would be understood by those made aware of this invention. Accordingly, coatings of the aluminum phosphate compositions described above and by way of the incorporated references (e.g., the Cerablak™ compounds, compositions and products available from Applied Thin Films, Inc. of Evanston, Ill.) can be applied to a wide range of substrate materials. Such equipment apparatus and configurations are described more fully in U.S. Pat. Nos. 6,951,770 and 6,878,871, each of which is incorporated herein by reference in its entirety.

Optionally, a substrate can be prepared by initial removal of loose surface debris, followed by degreasing with a suitable organic or aqueous solution (e.g., acetone or detergent/water) using one or more spray or dip applications, with a water and/or alcohol rinse. A drying oven (at temperatures ranging from about 50 C to 500 C) can be used to remove all solvents, employing flowing air, dry air, oxygen, nitrogen or any other inert gas for atmospheric sensitive substrates.

As described above and/or in conjunction with the incorporated references, a precursor solution of an aluminum phosphate composition can be sprayed on the substrate. Alternatively, the substrate can be dipped into one or more baths or reservoirs of a precursor solution. If both, multiple or all sides of such a substrate are to be coated, one or more spray nozzles can be configured, accordingly. Alternatively, with dip-coating, all substrate sides can be coated. Precursor composition can vary, without limitation, in terms of Al/P stoichiometry, viscosity, carrier (e.g., aqueous or non-aqueous) and additives present (either organic or inorganic). For example, as may be advantageous for high-emissivity coatings, a slurry can be prepared with a solvent (either aqueous or non-aqueous) carrier component.

With consideration of various volume and throughput requirements, coating compositions can be cured over lengths up to about 100 feet or more, with one or more ovens or heating/curing sources. For instance, an oven or furnace of sufficient length to enable drying and curing according to a set schedule can be provide an effective temperature ranging from about 50 C to 1,000 C, with a residence time depending upon speed and length of an effective heating/curing zone. Such a zone can vary with one or more heating or curing sources (e.g., UV/IR, flowing heated air, other or inert gas or resistive heating source). A cured, applied coating can be cleaned with an appropriate solvent, then dried before application of a subsequent coating. Alternatively, as can be employed with composites comprising temperature-sensitive substrates (e.g., certain plastics) or with high throughput systems, curing can be accomplished with a suitable heat source in such a way as to heat the coating component at a relatively higher temperature, while keeping the substrate at a relatively lower temperature (e.g., at about 250 C or below), for a time sufficient (e.g., less than about 1 hour) for coating cure without deleterious impact or effect on the substrate.

Figure 17:
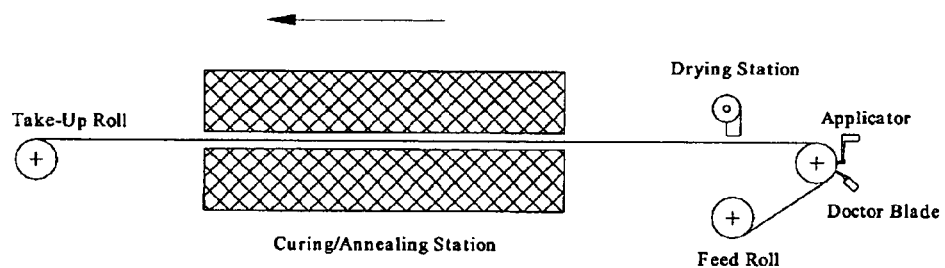
FIG. 17 and FIG. 18 schematically illustrate roll-to-roll processing and resulting composite configurations in accordance with this invention.
Figure 18:
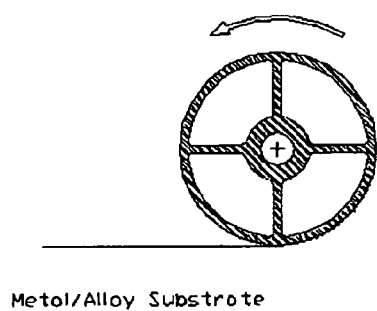

For various process-related considerations, it can be desirable to roll the substrate at right angles prior to movement along or through a heating/curing source. If the substrate is reasonably wet or uncured, coating damage from bending will be minimal. Depending upon initial surface roughness, a substrate can be electopolished or mechanically polished, as would be understood in the art, prior to cleaning and coating application. Regardless, reference is made to schematic FIGS. 17 and 18 for further illustration of roll to roll/continuous coating processes, and a non-limiting wound or rolled composite configuration resulting therefrom.

We claim:

1. A device comprising an electronic or optoelectronic component and a metal or metal alloy foil, wherein the metal is stainless steel, titanium, magnesium, nickel-based alloys or a superalloy, or a plastic substrate component with a coating thereon, wherein the coating comprises an amorphous aluminum phosphate compound containing Al—O—Al bonds and having an aluminum to phosphorous atomic ratio from about 0.5:1 to about 25:1 and forming a diffusion or a gas permeation barrier coating onto the substrate and is electrically insulating, and wherein the aluminum phosphate compound coating is deposited as a film on the substrate from a solution of phosphate ester and an aluminum salt and heated to a temperature and for a time sufficient to cure the coating while the substrate is heated to a lower temperature.

2. A device of claim 1 in which the substrate is flexible.

3. A device of claim 1 in which the coating is a dielectric.

4. A device of claim 1 wherein the coating is cured at a temperature of above 500° C. while the substrate is heated to no more than 250° C.

5. A device of claim 1 wherein the film on the substrate surface is heated to more than 200° C.

6. A device of claim 1 wherein the substrate is a metal or metal alloy foil.

7. A device of claim 6 wherein the substrate is a stainless steel alloy.

8. A device of claim 6 wherein the metal or metal alloy foil has a thickness dimension less than about 0.25 mm.

9. A device of claim 1 wherein the substrate is plastic.

10. A device of claim 1 wherein the film is cured for a time sufficient to at least partially remove ester moieties in the coating.

11. A device of claim 1 useful as a photovoltaic or solar cell.

12. A device of claim 11 in which the coating is a protective layer between an electrical back contact and a conductive substrate.

13. A device of claim 1 in which the coating is an electrically insulating layer on a conductive substrate.

14. A device of claim 13 in which the electronic or optoelectronic component is a photovoltaic component.

15. A device of claim 1 comprising a flexible display.

16. A device of claim 1 in which the coating protects a semiconductor.

17. A device of claim 1 comprising at least one interlayer component between the substrate and the coating.

18. A device comprising a metal or metal alloy foil, wherein the metal is stainless steel, titanium, magnesium, nickel-based alloys or a superalloy, or a plastic substrate with a dielectric coating thereon, wherein the coating comprises an amorphous aluminum phosphate compound containing Al—O—Al bonds and having an aluminum to phosphorous atomic ratio from about 0.5:1 to about 25:1 and forming a diffusion or a gas permeation barrier coating onto the substrate and is electrically insulating, and wherein the aluminum phosphate compound coating is deposited as a film on the substrate from a solution of phosphate ester and an aluminum salt and heated to a temperature and for a time sufficient to cure the coating while the substrate is heated to a lower temperature, wherein the device is useful as an electronic or optoelectronic component.

19. A device of claim 18 wherein the coating is cured at a temperature of above 500° C. while the substrate is heated to no more than 250° C.

20. A device of claim 19 wherein the film is cured for a time sufficient to at least partially remove ester moieties in the coating.

21. A device of claim 18 wherein
the film on the substrate surface is heated to more than 200° C.

22. A device of claim 18 comprising at least one interlayer component between the substrate and the coating.

23. A device of claim 18 in which the coating protects a semiconductor.

* * * * *

UNITED STATES PATENT AND TRADEMARK OFFICE
CERTIFICATE OF CORRECTION

PATENT NO. : 8,021,758 B2  
APPLICATION NO. : 11/244539  
DATED : September 20, 2011  
INVENTOR(S) : Sankar Sambasivan and Krishnaswamy K. Rangan Page 1 of 1

It is certified that error appears in the above-identified patent and that said Letters Patent is hereby corrected as shown below:

Column 1, Line 55:
"melt the glass fits and" should read --melt the glass frits and--.

Column 6, Line 20:
"film of above characters" should read --film of the above characters--.

Column 10, Line 61:
"temperature of about 1000 C" should read --temperature of about 1000°C--.

Column 13, Line 32:
"(1 tan diamond abrasive" should read --(1 μm diamond abrasive--.

Column 14, Line 9:
"Hexyloy" should read --Hexoloy--.

Column 14, Line 10:
"Hexyloy" should read --Hexoloy--.

Column 14, Line 11:
"Hexyloy" should read --Hexoloy--.

Column 26, Line 66
"1473.1720, 2987 cm$_{-1}$" should read --1473, 1720, 2987 cm$_{-1}$--.

Signed and Sealed this  
Fourteenth Day of February, 2012

David J. Kappos  
*Director of the United States Patent and Trademark Office*